United States Patent [19]
Okumura et al.

[11] Patent Number: 5,586,287
[45] Date of Patent: Dec. 17, 1996

[54] INFORMATION PROCESSING APPARATUS CAPABLE OF HOLDING STORAGE CONTENTS OF PSRAM EVEN WHEN SYSTEM CLOCK COMES TO ABNORMAL HALT

[75] Inventors: Masao Okumura, Yamatokooriyama; Toshio Matsumoto, Nara; Tetsuya Inoue, Yamatokooriyama, all of Japan

[73] Assignee: Sharp Kabushiki Kaisha, Osaka, Japan

[21] Appl. No.: 437,381

[22] Filed: May 9, 1995

[30] Foreign Application Priority Data

May 13, 1994 [JP] Japan ........................... 6-100180

[51] Int. Cl.⁶ .................................. G06F 13/00
[52] U.S. Cl. ........................... 395/433; 365/222
[58] Field of Search ................ 395/433; 365/222

[56] References Cited

U.S. PATENT DOCUMENTS

| | | | |
|---|---|---|---|
| 4,845,419 | 7/1989 | Hacker | 320/39 |
| 5,027,327 | 6/1991 | Kobayashi et al. | 365/222 |
| 5,031,147 | 7/1991 | Maruyama et al. | 365/189.07 |
| 5,206,830 | 4/1993 | Isobe et al. | 365/194 |
| 5,379,400 | 1/1995 | Barakat et al. | 395/433 |
| 5,418,920 | 5/1995 | Kuddes | 395/433 |
| 5,473,770 | 12/1995 | Vrba | 395/433 |

FOREIGN PATENT DOCUMENTS 6 76568  3/1994  Japan .

*Primary Examiner*—David L. Robertson

[57] ABSTRACT

The invention provides an information processing apparatus which is equipped with PSRAM (pseudo static random access memory) having a self-refresh mode and which is capable of holding storage contents of the PSRAM even when a CPU system clock generator comes to an abnormal halt. The information processing apparatus has a self-refresh setter which produces an output signal of a high or low specific level when the system clock generator is oscillating, and which, when the system clock generator stops oscillation, inverts the level of the output signal after a certain time elapse since the stop of oscillation. The information processing apparatus further has logic circuits for holding a chip-enable signal at a level representing that the PSRAM is not accessed, and holding a refresh signal at a level representing that the PSRAM is refreshed, respectively, after a certain time elapse since the system clock generator stops oscillation, based on an output of the self-refresh setter.

4 Claims, 18 Drawing Sheets

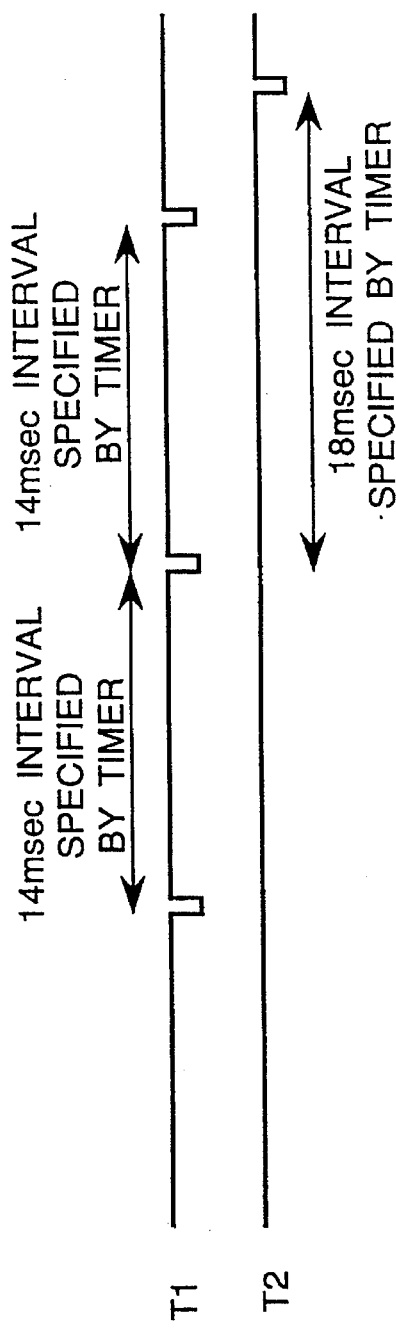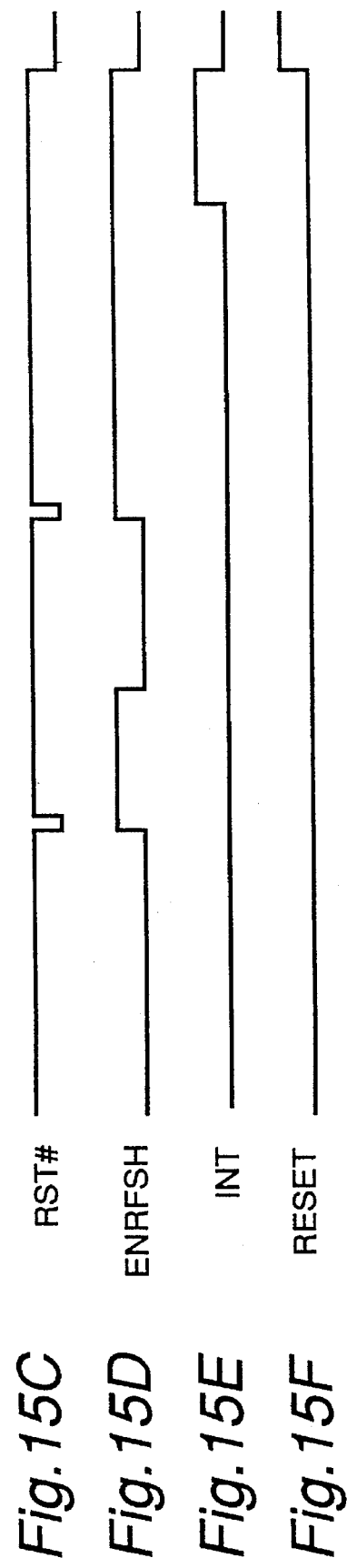
Fig.15A T1
Fig.15B T2
Fig.15C RST#
Fig.15D ENRFSH
Fig.15E INT
Fig.15F RESET
14msec INTERVAL SPECIFIED BY TIMER
14msec INTERVAL SPECIFIED BY TIMER
18msec INTERVAL SPECIFIED BY TIMER

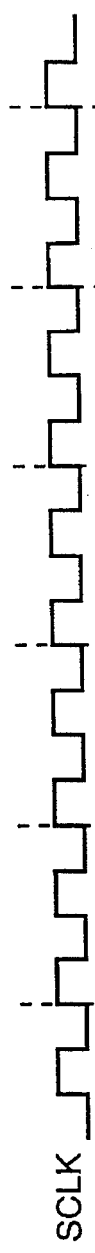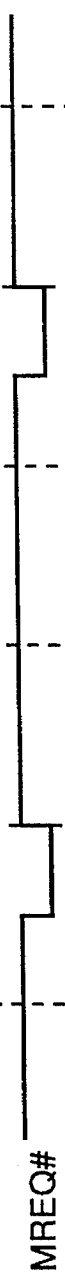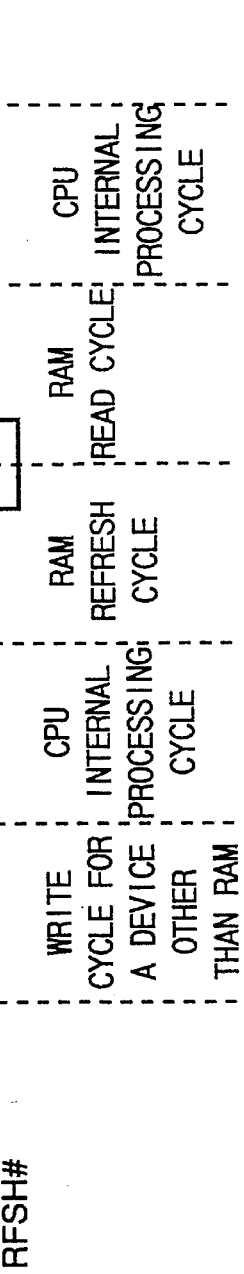
Fig. 17A PRIOR ART
Fig. 17B PRIOR ART
Fig. 17C PRIOR ART
Fig. 17D PRIOR ART
Fig. 17E PRIOR ART

INFORMATION PROCESSING APPARATUS CAPABLE OF HOLDING STORAGE CONTENTS OF PSRAM EVEN WHEN SYSTEM CLOCK COMES TO ABNORMAL HALT

BACKGROUND OF THE INVENTION

1. Field of the Invention

The present invention relates to an information processing apparatus having a pseudo static random access memory (hereinafter, referred to as PSRAM). More particularly, the invention relates to an information processing apparatus that performs refresh to maintain the data of PSRAM.

2. Description of the Prior Art

In recent years, the PSRAM has been used for rapidly increasing numbers of applications as a device having both the feature of large capacity and low price by virtue of its memory cell array architecture similar to and as simple as that of a dynamic random access memory (DRAM), and the feature of simplicity in interface by adopting the non-multiplex addressing system similar to that of a static random access memory (SRAM). However, because of the memory cell array architecture similar to that of DRAM, the PSRAM needs to be subjected to the operation of so-called refresh periodically (every few milliseconds to few tens milliseconds, the period differing from memory to memory) in order to maintain data.

The mode of refresh operation for the PSRAM can be classified roughly into two types, auto-refresh mode and self-refresh mode. In the auto-refresh mode, a CPU (Central Processing Unit) discriminates a period in which the PSRAM is not accessed, and makes the PSRAM refreshed based on a clock during the period. On the other hand, in the self-refresh mode, the PSRAM itself performs refresh irrespectively of the clock. As a result, the refresh is performed even with the clock halted.

Conventionally, the PSRAM has actually been refreshed by such a system as shown in FIG. 18. In response to control signals S4, S5 from a CPU 901 for instructing the operation and halt of the system clock, an oscillation controller 906 generates a signal STP. Responsively to the level of the signal STP, either "H" (High) or "L" (Low), a CPU system clock generator 903 oscillates or stops oscillation. An output of the oscillation controller 906 and an output of the CPU system clock generator 903 are combined together by a NOR circuit 991 to generate a system clock CG1. A count clock generator 904 is normally generating a count clock CG2. The frequency of the system clock CG1 is set far higher than that of the count clock CG2. A refresh controller 905 controls address refresh and auto-refresh in response to control signals S1, S2, respectively, fed from the CPU 901. A control signal S3 from the CPU 901 and a chip-enable signal CE# fed from the CPU 901 via the refresh controller 905 are combined together by an OR circuit 992 and inputted to a CE# terminal of PSRAM 902. Also, a signal obtained by delaying the control signal S3 derived from the CPU 901 by a time that depends on the CR time constant of a delay circuit 907, and a refresh signal RFSH# fed from the CPU 901 via the refresh controller 905 are combined together by a NOR circuit 993 and inputted to a RFSH# terminal of the PSRAM. When the CE# (# representing inversion; alike hereinafter) terminal and RFSH# terminal of the PSRAM 902 are maintained "H" and "L", respectively, for a specified time interval or more, the PSRAM 902 is set to the self-refresh mode.

However, in the above-described system, if the CPU system clock 903 comes to a halt for some reason (abnormal halt) without setting the PSRAM 902 to the self-refresh mode, the PSRAM 902 remains unrefreshed for a certain time interval or more so that the storage contents of the PSRAM 902 will be lost, disadvantageously.

SUMMARY OF THE INVENTION

A first object of the present invention is therefore to provide an information processing apparatus capable of maintaining storage contents of PSRAM even when the CPU system clock comes to an abnormal halt.

Also in the above-described system, when the power supply line voltage has lowered such that the PSRAM turns into the self-refresh mode, the CPU 901 may access the PSRAM 902 for some reason. This poses a problem that data of the PSRAM 902 may be destroyed.

A second object of the present invention is therefore to provide an information processing apparatus capable of securely preventing data destruction of PSRAM when the power supply line voltage has lowered such that the PSRAM turns into the self-refresh mode.

Also, it has been a conventional practice that in the auto-refresh mode an execution cycle for exclusive use of refresh is provided so that access to the PSRAM will never take place during the cycle period, as shown in FIGS. 17A, 17B, . . . , 17E, for the purpose of preventing any data destruction. In this case, however, the processing efficiency deteriorates proportionally to the execution cycle for exclusive use of refresh, resulting in lower-speed of program execution, as another problem.

A third object of the present invention is therefore to provide an information processing apparatus capable of properly refreshing PSRAM without deteriorating the processing efficiency.

In order to achieve the above first object, there is provided an information processing apparatus having:

a system clock generator for generating or stopping generating a system clock;

a central processing unit (CPU) for outputting a chip-enable signal representing by high or low level whether or not a pseudo static random access memory (PSRAM) is accessed, and a refresh signal representing by high or low level whether or not the PSRAM is refreshed, by using the system clock as a reference; and PSRAM which has a chip-enable terminal for receiving a chip-enable signal and a refresh terminal for receiving a refresh signal and which has a self-refresh mode in which the PSRAM itself refreshes its storage contents when the chip-enable terminal is held at a level representing that the PSRAM is not accessed and the refresh terminal is held at a level representing that the PSRAM is not refreshed, respectively, for a specified time duration or more, the information processing apparatus comprising:

a self-refresh setter for, when the system clock generator is oscillating, producing an output signal of a high or low specific level and for, when the system clock generator has stopped oscillation, producing the output signal as it is inverted in level after a certain time elapse since the stop of oscillation; and logic circuits for latching a chip-enable signal inputted to the chip-enable terminal of the PSRAM at a level representing that the PSRAM is not accessed, and latching a refresh signal inputted to the refresh terminal of the PSRAM at a level representing that the PSRAM is refreshed, respectively, after a certain time elapse since the system clock generator has stopped oscillation, based on an output of the self-refresh setter.

In the above information processing apparatus, when the system clock generator comes to an oscillation halt, the output of the self-refresh setter is inverted in a certain time elapse. The logic circuits latch the chip-enable signal inputted to the chip-enable terminal of the PSRAM at a level representing that the PSRAM is not accessed, and the refresh signal inputted to the refresh terminal of the PSRAM at a level representing that the PSRAM is refreshed, respectively, in a certain time elapse since the oscillation halt of the system clock generator based on the output of the self-refresh setter. As a result, the PSRAM is set to the self-refresh mode in a certain time elapse since the oscillation halt of the system clock generator. Accordingly, even when the system clock generator comes to an abnormal halt, storage contents of the PSRAM are maintained.

In order to achieve the above second object, there is provided an information processing apparatus having:

a CPU for outputting a chip-enable signal representing by high or low level whether or not PSRAM is accessed, and a refresh signal representing by high or low level whether or not the PSRAM is refreshed; and PSRAM having a chip-enable terminal for receiving the chip-enable signal and a refresh terminal for receiving the refresh signal, and having a self-refresh mode in which the PSRAM itself refreshes its storage contents when the chip-enable terminal is held at a level representing that the PSRAM is not accessed and the refresh terminal is held at a level representing that the PSRAM is not refreshed, respectively, for a certain time duration or more, the information processing apparatus comprising a voltage detector for detecting whether or not a power supply voltage is not less than a reference value and producing an output signal representing a detection result, wherein the CPU has a means for holding a chip-enable signal inputted to the chip-enable terminal of the PSRAM at the level representing that the PSRAM is not accessed, and holding a refresh signal inputted to the refresh terminal of the PSRAM at the level representing that the PSRAM is refreshed, respectively, when the CPU has received an output signal of the voltage detector and the power supply voltage is less than the reference value.

In the above information processing apparatus, when the power supply voltage becomes lower than a reference value, the voltage detector produces an output signal representing so. The CPU latches the chip-enable signal inputted to the chip-enable terminal of the PSRAM at a level representing that the PSRAM is not accessed, and the refresh signal inputted to the refresh terminal of the PSRAM at a level representing that the PSRAM is refreshed, respectively, based on the output signal of the voltage detector. As a result, the PSRAM is set to the self-refresh mode in a certain time elapse. Accordingly, even when the system clock generator comes to an abnormal halt, storage contents of the PSRAM are maintained.

In order to achieve the above third object, there is provided an information processing apparatus comprising:

PSRAM which is refreshed upon receiving a refresh signal representing by high or low level whether or not the PSRAM is refreshed if the refresh signal is at active level representing that the PSRAM is refreshed;

a CPU for outputting an execution-cycle reference signal representing an execution cycle at which the PSRAM is processed and a chip-enable signal representing by high or low level whether or not the PSRAM is accessed;

a counter for counting a number of times to which the PSRAM has been refreshed after the counter is reset, and for outputting a refresh-enable instruction signal representing that refresh is executable, throughout a period until a necessary number of refreshes needed to refresh the PSRAM completely is counted up, and outputting a refresh-halt instruction signal representing that refresh is halted after the necessary number of refreshes has been counted up;

a timer for starting count when the counter is reset, and outputting a first reset signal to reset the counter when the timer counts up a first set period corresponding to a refresh cycle specified for the PSRAM; and a refresh controller for outputting the refresh signal at the active level to the PSRAM in synchronization with the execution-cycle reference signal when the refresh controller has received from the counter a refresh-enable instruction signal and moreover has received from the CPU a chip-enable signal of the level representing that the PSRAM is not accessed, and for outputting the refresh signal at an inactive level representing that the PSRAM is not refreshed when the refresh controller has received from the counter a refresh-halt instruction signal and moreover has received from the CPU a chip-enable signal of the level representing that the PSRAM is accessed.

The above information processing apparatus operates in the following manner. First, at a start of the operation, the counter is reset. Immediately after the reset, the counter outputs a refresh-enable instruction signal representing that refresh is executable. The refresh controller receives the refresh-enable instruction signal from the counter. At this point, the refresh controller, if it has further received from the CPU a chip-enable signal of a level representing that the PSRAM is not accessed, outputs to the PSRAM a refresh signal at active level in synchronization with the execution-cycle reference signal derived from the CPU. Accordingly, the PSRAM is refreshed in synchronization with the execution-cycle reference signal in an execution cycle during which it is not accessed. Principally, the PSRAM is refreshed once during one execution cycle of the CPU. Meanwhile, when the chip-enable signal from the CPU is of a level representing that the PSRAM is accessed, the refresh controller outputs the refresh signal at inactive level to the PSRAM. Accordingly, in execution cycles during which the PSRAM is accessed, refresh is not performed. The counter counts up the number of times to which the PSRAM has been refreshed, outputting a refresh-enable instruction signal representing that refresh is executable, throughout a period until the number of refreshes required for the PSRAM to be refreshed completely. Accordingly, in response to the level of the chip-enable signal outputted by the CPU, refresh is executed or disabled in synchronization with the above execution-cycle reference signal. The counter outputs a refresh-halt instruction signal representing that refresh is halted after the necessary number of refreshes has been counted up. Responsively to this, the refresh controller outputs to the PSRAM the refresh signal at inactive level. Accordingly, in this state, refresh is not performed. Then, when the timer, starting time count from when the counter is reset, has counted up a first set period corresponding to the refresh cycle specified for the PSRAM, it outputs a first reset signal for resetting the counter. Receiving this first reset signal, the counter is reset. Accordingly, after the PSRAM is refreshed once completely, the operation returns to the starting state, and the PSRAM is refreshed once again.

As seen above, in the information processing apparatus, since refresh is performed in synchronization with the execution cycle of the CPU, the processing efficiency will never deteriorate. Also, since the refresh is not performed in an execution cycle during which the PSRAM is accessed, there will never occur such malfunction as would destroy data due to competition of refresh with access to the PSRAM. Also, since the refresh will not be performed until the counter is reset after it has counted up the necessary number of refreshes, excessive refresh will never be executed, compared with the data hold specification of the PSRAM. Accordingly, electric current consumption is suppressed from increasing, so that refresh is performed properly.

It is noted that, for example, when the refresh cycle of the PSRAM is specified as 32 msec, the first set period is set to a time interval shorter than the time 32 msec.

In the above information processing apparatus, since refresh is performed in an execution cycle during which the PSRAM is not accessed, there could be such a case that the PSRAM has not been refreshed completely at a time point when the first set period expires, for example under the running of a program that involves successive accesses to the PSRAM over a long time.

In order to cope with such a case, in an information processing apparatus according to one embodiment, the refresh controller outputs an interrupt request signal to the CPU if the refresh controller has received from the counter a refresh-enable instruction signal at a time point when the timer outputs the first reset signal; and the CPU has a means for executing an interrupt program in which a process other than accessing the PSRAM is executed, while holding the chip-enable signal at a level representing that the PSRAM is not accessed, throughout a period from when the CPU receives the interrupt request signal until the counter outputs a refresh-halt instruction signal.

With the above arrangement, if a refresh-enable instruction signal has been received from the counter at a time point when the timer outputs a first reset signal, the refresh controller outputs an interrupt request signal to the CPU. More specifically, if the PSRAM has not been refreshed completely at a time point when the first set period expires, the refresh controller outputs an interrupt request signal to the CPU. The CPU suspends the currently executed program at a time point when it receives the interrupt request signal. Instead, the CPU executes an interrupt program for executing a process other than accessing the PSRAM, while it holds the chip-enable signal at a level representing that the PSRAM is not accessed. As a result, the refresh generator receives a refresh-enable instruction signal from the counter, and moreover receives from the CPU a chip-enable signal of a level representing that the PSRAM is not accessed. Accordingly, the refresh controller outputs a refresh signal to the PSRAM at active level in synchronization with the execution-cycle reference signal. In this state, the PSRAM is refreshed completely. When the PSRAM is refreshed completely and the counter has counted up the necessary number of refreshes, the counter outputs a refresh-halt instruction signal from now on. With the refresh-halt instruction signal outputted, the CPU resumes the execution of the suspended original program based on the refresh-halt instruction signal.

As seen above, in the information processing apparatus of the above embodiment, if the PSRAM has not been refreshed completely at a time point when the first set period expires, the original program is temporarily suspended and an interrupt program for executing a process other than accessing the PSRAM is executed, whereby refresh of the PSRAM is enabled. Thus, proper refresh of the PSRAM is attained without shortage.

Also, the information processing apparatus of the above embodiment involves processing by software; for example, with an interrupt to the CPU, refresh of the PSRAM is enabled through execution of an interrupt program. Therefore, it is desirable to take measures in terms of hardware in the event of a runaway of the software processing. Thus, the timer is assumed to continue the time count after the first set period has expired and, when having counted up a previously set second set period, output a second reset signal for resetting the operation of the CPU. Upon the output of this second reset signal, the CPU is reset regardless of what are the contents of the program that is currently executed. For example, the CPU, when reset, initializes all the operations and executes the initial program that has been so set as to be executed after a reset. As a result, the CPU forcedly goes out of the abnormal state such as a runaway, returning to the normal operation.

With the arrangement as described above, in the event that any abnormality such as a runaway of software has erupted, the CPU is forcedly reset so as to return to the normal operation. Accordingly, refresh of the PSRAM is performed properly.

Further, if the first set period is set to one half or less of the refresh cycle specified for the PSRAM, it becomes possible to perform refresh within a manufacturer-specified range, whatever conditions the access to the PSRAM is subject to.

More specifically, assume that no access to the PSRAM has been made in the first-time first set period, where a number of times of refreshes necessary for early stage of this first set period is completed, and that accesses to the PSRAM are successively made without rest in the subsequent second-time first set period, where an interrupt handling after the expiration of the set period has made refresh enable for the first time. Even in such a situation, the length of a period from when refresh is performed once until when refresh is performed for the next time to the same memory area is, at most, less than twice the first set period. Accordingly, if the first set period is set to one half or less of the refresh cycle specified for the PSRAM, refresh will be performed at all times within the refresh cycle that the manufacturer specified. As a result, storage data of the PSRAM is maintained.

Also, when the second set period is set to a length exceeding the time necessary for the PSRAM to be refreshed in succession completely, the second reset signal will not be outputted if the interrupt program is executed normally, and the second reset signal will be outputted only when an abnormality such as a runaway of software has erupted.

More specifically, when the interrupt program upon reception of a CPU interrupt has been executed normally, the PSRAM is refreshed necessarily once per CPU's one execution cycle. As a result, the number of execution cycles for the PSRAM to be refreshed completely is naturally determined, so that in normal state a complete sequence of refreshes of the PSRAM is finished necessarily in a time corresponding to the above number of execution cycles, or a time necessary for the PSRAM to be refreshed in succession completely (upon completion of the refresh, both the counter and the timer are reset). In this connection, if the second set period is set to a length exceeding the time necessary for the PSRAM to be refreshed in succession completely, then in normal state the timer will neither count the second set period nor output the second reset signal. If the timer counts the so-determined second set period, it suggests that the interrupt program is not executed normally for some factor, where an abnormality such as a runaway of software has erupted. Accordingly, the timer outputs the second reset signal only when an abnormality has erupted. The CPU is reset by this second reset signal, so that it goes out of the abnormal state and returns to normal operation. As a result, refresh necessary for data of the PSRAM to be maintained is achieved properly.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIGS. 15A, 15B, 15C, . . . , 15F are each a diagram showing transitions of each signal in the information processing apparatus of FIG. 14;

FIGS. 17A, 17B, 17C, . . . , 17E are a time chart for explaining the operation of a conventional system.

DETAILED DESCRIPTION OF THE PREFERRED EMBODIMENTS

Hereinbelow, the information processing apparatus of the present invention is described in more detail by embodiments thereof.

(First Embodiment)

Figure 1:
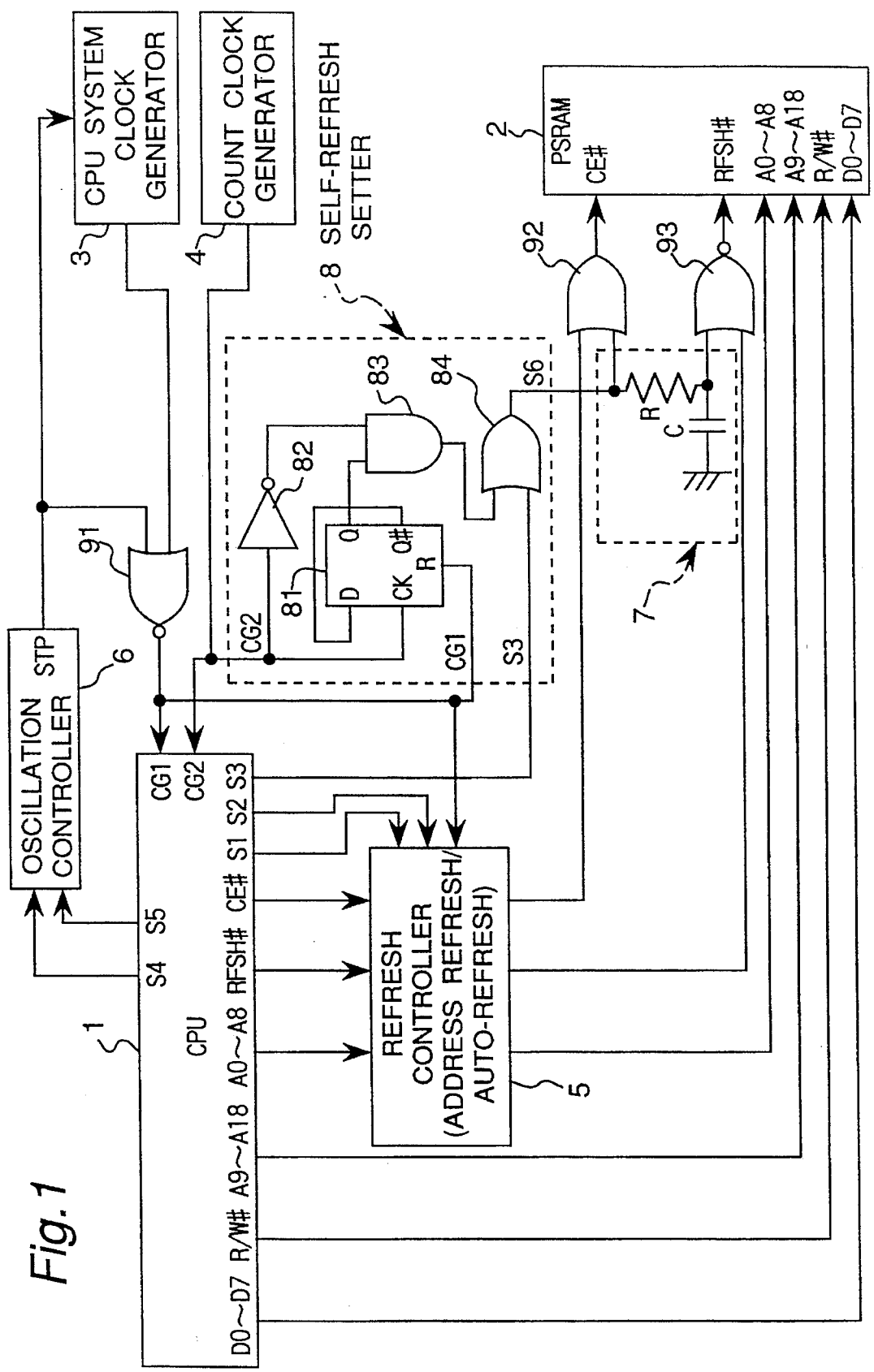
FIG. 1 is a diagram showing the arrangement of the information processing apparatus according to a first embodiment of the present invention.

FIG. 1 shows the general construction of the information processing apparatus according to a first embodiment of the present invention. This information processing apparatus comprises a CPU 1, PSRAM 2, an oscillation controller 6, a CPU system clock generator 3 that oscillates or stops oscillation in response to a setting by the oscillation controller 6, a count clock generator 4 that is normally oscillating, a refresh controller 5 for setting the address refresh or the auto-refresh, a delay circuit 7 composed of a capacitor C and a resistor R, and a self-refresh setter 8. Reference numerals 91, 93 each denote a NOR circuit, 92 denotes an OR circuit. The NOR circuit 93 and the OR circuit 92 constitute a logic circuit. The CPU 1 outputs and inputs data D0 to D7 in read or write operation, while it outputs a read/write control signal R/W# representing that a read or write operation is performed, higher-order addresses A9 to A18, lower-order addresses A0 to A8, a refresh signal RFSH# representing whether or not refresh is performed, a chip-enable signal CE# representing whether or not the PSRAM is accessed, and control signals S1 to S5 for refresh operation. The PSRAM 2 has a CE# terminal for receiving a chip-enable signal, an RFSH# terminal for receiving a refresh signal, A0 to A8 terminals for receiving lower-order addresses, A9 to A18 terminals for receiving higher-order addresses, an R/W# terminal for receiving a read/write control signal, and D0 to D7 terminals for inputting and outputting data.

The self-refresh setter 8 comprises a D flip-flop (hereinafter, referred to as D-F/F) 81, an inverter 82, an AND circuit 83, and an OR circuit 84. A count clock CG2 is inverted by the inverter, and inputted to the AND circuit 83 together with Q output of the D-F/F 81. An output of the AND circuit 83 and a signal S3 from the CPU 1 are combined together by the OR circuit 84 and taken out as an output S6 of the self-refresh setter 8. The output S6 of the self-refresh setter 8 and a chip-enable signal CE# fed from the CPU 1 via the refresh controller 5 are combined together by the OR circuit 92 and inputted to the CE# terminal of the PSRAM 2. Also, a signal obtained by delaying the output S6 of the self-refresh setter 8 to a time that depends on the CR time constant of the delay circuit 7, and a refresh signal RFSH# fed from the CPU 1 via the refresh controller 5 are combined together by the NOR circuit 93 and inputted to the RFSH# terminal of the PSRAM. It is arranged that when the CE# terminal and RFSH# terminal of the PSRAM 2 are maintained for a certain time interval or more at "H" and "L", respectively, the PSRAM 2 is set to the self-refresh mode.

The oscillation controller 6 generates a signal STP in response to signals S4, S5 from the CPU 1 for instructing the operation or halt of the system clock. Depending on whether the signal STP is "H" or "L", the CPU system clock generator 3 oscillates or stops oscillating. The output STP of the oscillation controller 6 and the output of the CPU system clock generator 3 are combined together by the NOR circuit 91 to generate a system clock CG1. The count clock generator 4 is normally generating a count clock. CG2. It is noted that the rate of the system clock CG1 is set far higher than that of the count clock CG2. The refresh controller 5 controls the address refresh and the auto-refresh in response to the control signals S1, S2 from the CPU 1, respectively.

Figure 2:
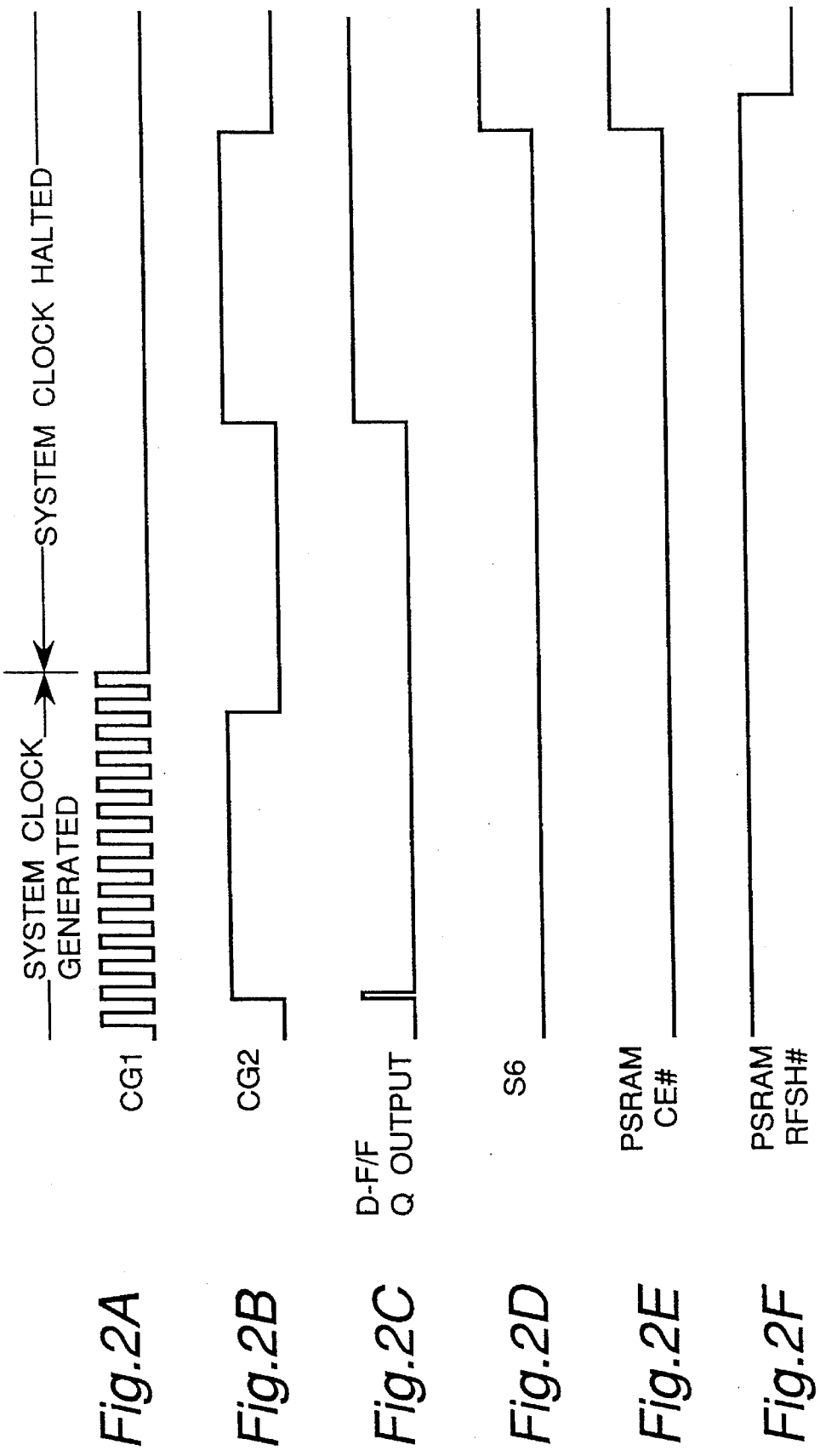
FIGS. 2A, 2B, 2C, . . . , 2F are each a diagram showing transitions of each signal in the information processing apparatus of FIG. 1.

As shown in FIGS. 2A, 2B, . . . , 2F, while the CPU system clock generator 3 is oscillating, the system clock CG1 periodically resets the D-F/F 81 of the self-refresh setter 8. So the output S6 of the self-refresh setter 8 remains "L" unless the control signal S3 from the CPU 1 goes "H" . Meanwhile, when the system clock generator 3 comes to a halt, the D-F/F 81 of the self-refresh setter 8 has obtained the count clock CG2. Therefore, the output S6 of the self-refresh setter 8 goes "H" after a certain time elapse since the CPU system clock generator 3 comes to a halt, regardless of whether the control signal S3 is "H" or "L". After the output S6 of the self-refresh setter 8 has become "H", the CE# first goes "H" and, in a time elapse that depends on the CR time constant of the delay circuit 7, the RFSH# goes "L". The CE# terminal of the PSRAM 2 is held at "H" and the RFSH# terminal is held at a "L" and, in a certain time elapse, the PSRAM 2 is set to the self-refresh mode.

As seen above, in this information processing apparatus, when the CPU system clock generator 3 comes to a halt, the PSRAM 2 can be set to the self-refresh mode after a certain time elapse. Accordingly, even when the CPU system clock generator 3 comes to an abnormal halt, storage contents of the PSRAM 2 can be maintained.

(Second Embodiment)

Figure 3:
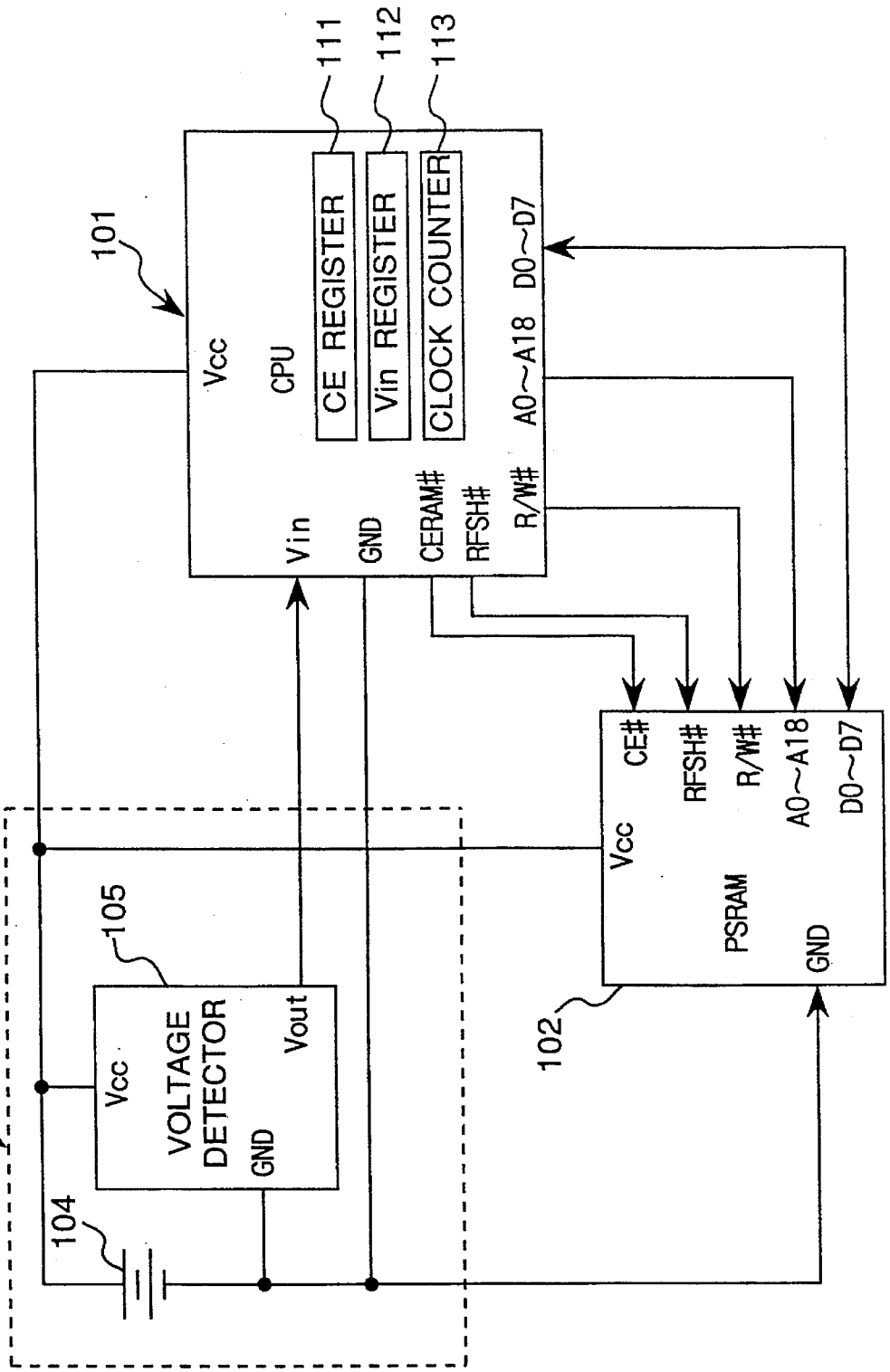
FIG. 3 is a diagram showing the arrangement of the information processing apparatus according to a second embodiment of the present invention.

FIG. 3 shows the general construction of the information processing apparatus according to a second embodiment of the present invention. This information processing apparatus comprises a CPU 101, PSRAM 102, and a memory control circuit 103 composed of a power supply (battery or the like) 104 and a voltage detector 105.

The voltage detector 105 of the memory control circuit 103 outputs an "H" as an output signal Vout if the power supply line voltage Vcc fed from the power supply 104 is not less than a reference value. The voltage detector 105 outputs an "L" as an output Vout if the power supply line voltage Vcc is less than the reference value.

The CPU 101 inputs and outputs data D0 to D7 for read or write operation, and moreover outputs addresses A0 to A18, a read/write control signal R/W# representing that read or write operation is performed, a refresh signal RFSH# representing whether or not refresh is performed, and a chip-enable signal CERAM# representing whether or not the PSRAM is accessed. The CPU 101 has a Vcc terminal and a GND terminal both connected to the power supply 104, and a Vin terminal for receiving the output Vout of the voltage detector 105.

In the CPU 101, there are provided a CE register 111, a Vin register 112, and a clock counter 113. The value of the CE register 111 is set according to the operating state of the read operation, write operation, refresh operation, and the like. When the CE register 111 is set at 1, the CPU 101 latches the chip-enable signal CERAM# at "H", thereby disabling access to the PSRAM 102. Also, the value of the Vin register 112 is set according to the output Vout of the voltage detector 105. When the Vin register 112 is set at 1, the CPU 101 latches the refresh signal RFSH# at "L", thereby setting the PSRAM 102 to the self-refresh mode.

When the Vin register 112 is set at 0, various operations such as read, write, and refresh operation are carried out normally. The clock counter 113 counts the elapsed time since the refresh mode is set.

The PSRAM 102 has a CE# terminal for receiving a chip-enable signal, a RFSH# terminal for receiving a refresh signal, an R/W# terminal for receiving a read/write control signal, A0 to A18 terminals for receiving an address, D0 to D7 terminals for inputting and outputting data, and Vcc terminal and GND terminal connected to the power supply 104.

Figure 5:
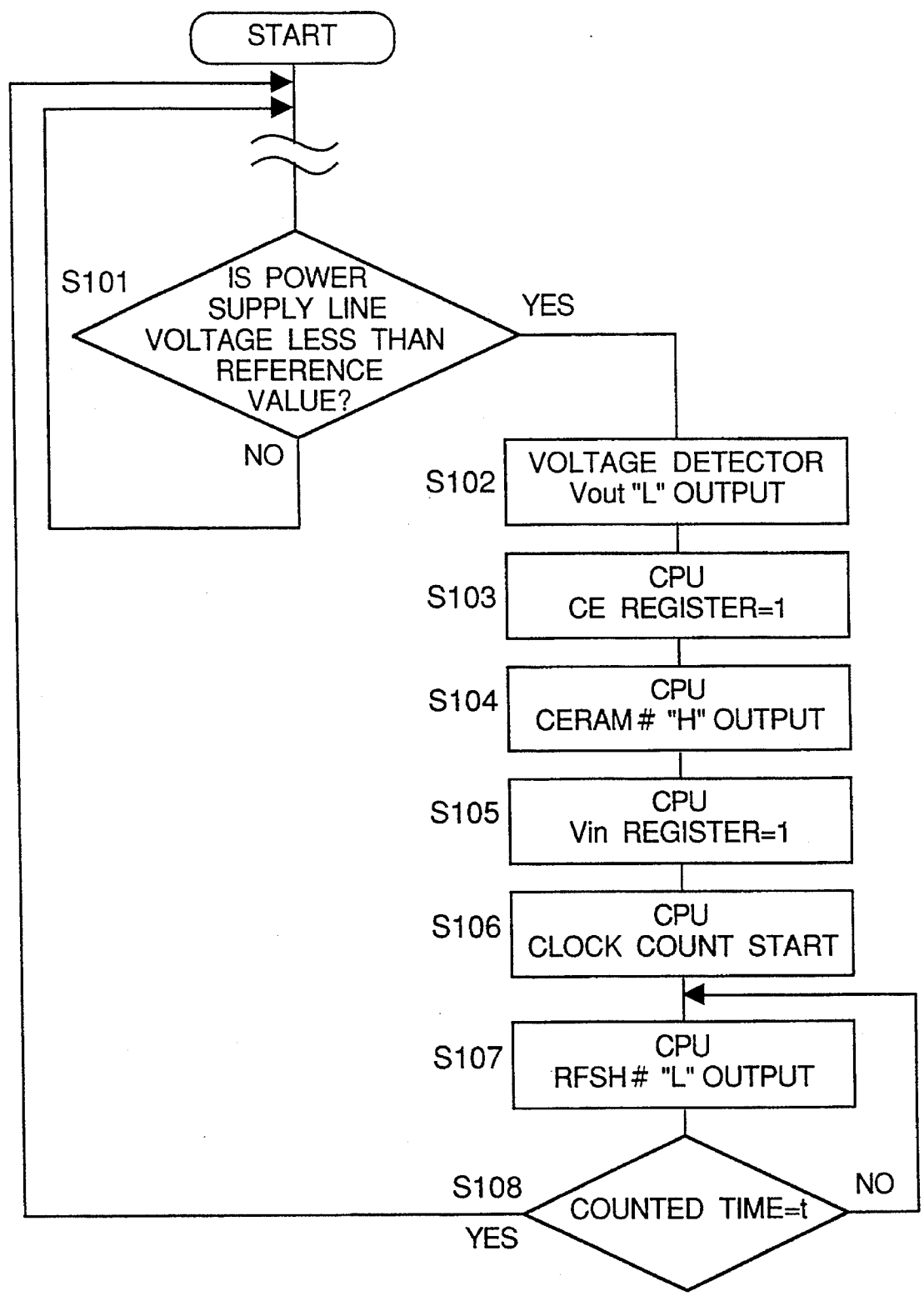
FIG. 5 is a diagram showing the flow chart for explaining the operating procedure of the information processing apparatus of FIG. 2.

The operation of this information processing apparatus is carried out by the CPU 101 according to the flow as shown in FIG. 5.

Figure 4:
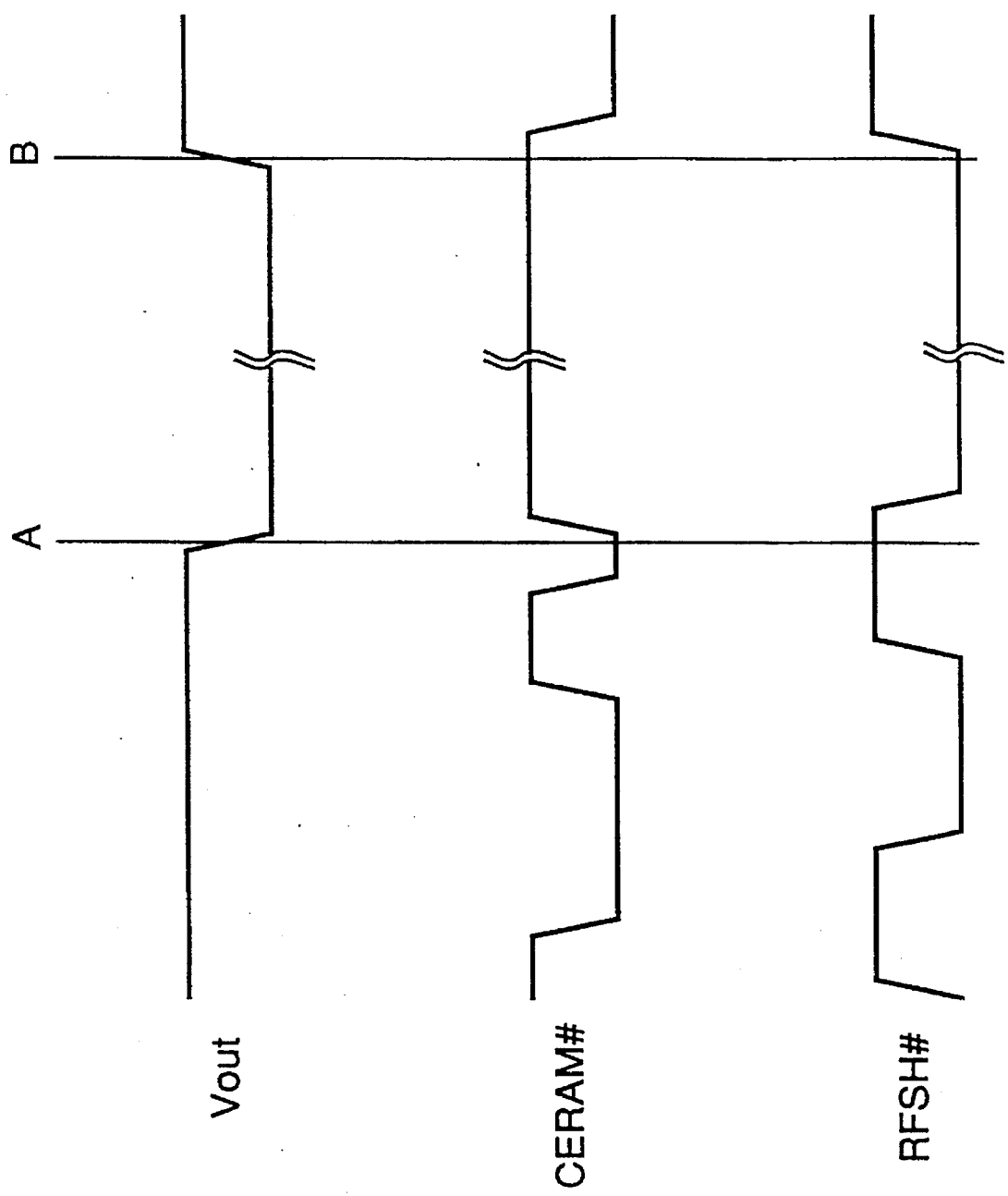
FIGS. 4A, 4B, 4C are each a diagram showing transitions of each signal in the information processing apparatus of FIG. 2.

First, it is decided by the voltage detector 105 whether or not the power supply line voltage Vcc is not less than a reference value (S101). If the power supply line voltage Vcc is not less than the reference value and, as a result, the output Vout of the voltage detector 105 as shown in FIG. 3 is at "H", then the Vin register 112 in the CPU 101 is set to 0. In this state, as shown in the left part of A line in FIGS. 4A, 4B, and 4C, various operations such as read, write, and refresh operation are carried out.

Meanwhile, if the power supply line voltage Vcc is less than the reference value and, as a result, the output Vout of the voltage detector 105 is at "L" (S102), then the CPU 101 sets the CE register 111 to a value of 1 (S103). When the CE register 111 is set at 1, the CPU 101 makes the chip-enable signal CERAM# an "H" (S104). As a result, as shown in a portion defined by lines A to B in FIGS. 4A, 4B, and 4C, access to the PSRAM is disabled. Subsequently, the CPU 101 sets the Vin register 112 to a value of 1 (S105), immediately starting count by the clock counter 113 (S106). When the Vin register 112 comes to be set at 1, the CPU 101 makes the refresh signal RFSH# an "L" (S107). As a result, the PSRAM 102 is set to the self-refresh mode. Until the count of a clock counter 107 reaches a previously set time t, the CPU 101 holds the refresh signal RFSH# as it is at "L" (S108). After an elapse of time t, if the Vin register 112 still remains being set at 1, the program returns to step S101 and repeats the sequence of operations S101 through S108.

As seen above, in this information processing apparatus, the voltage detector 105 detects whether the power supply line voltage Vcc is high or low level. If the power supply line voltage is lower than a reference value, access to the PSRAM is disabled, and thereafter the self-refresh mode is set. Accordingly, the PSRAM can be securely prevented from data destruction.

(Third Embodiment)

Figure 6:
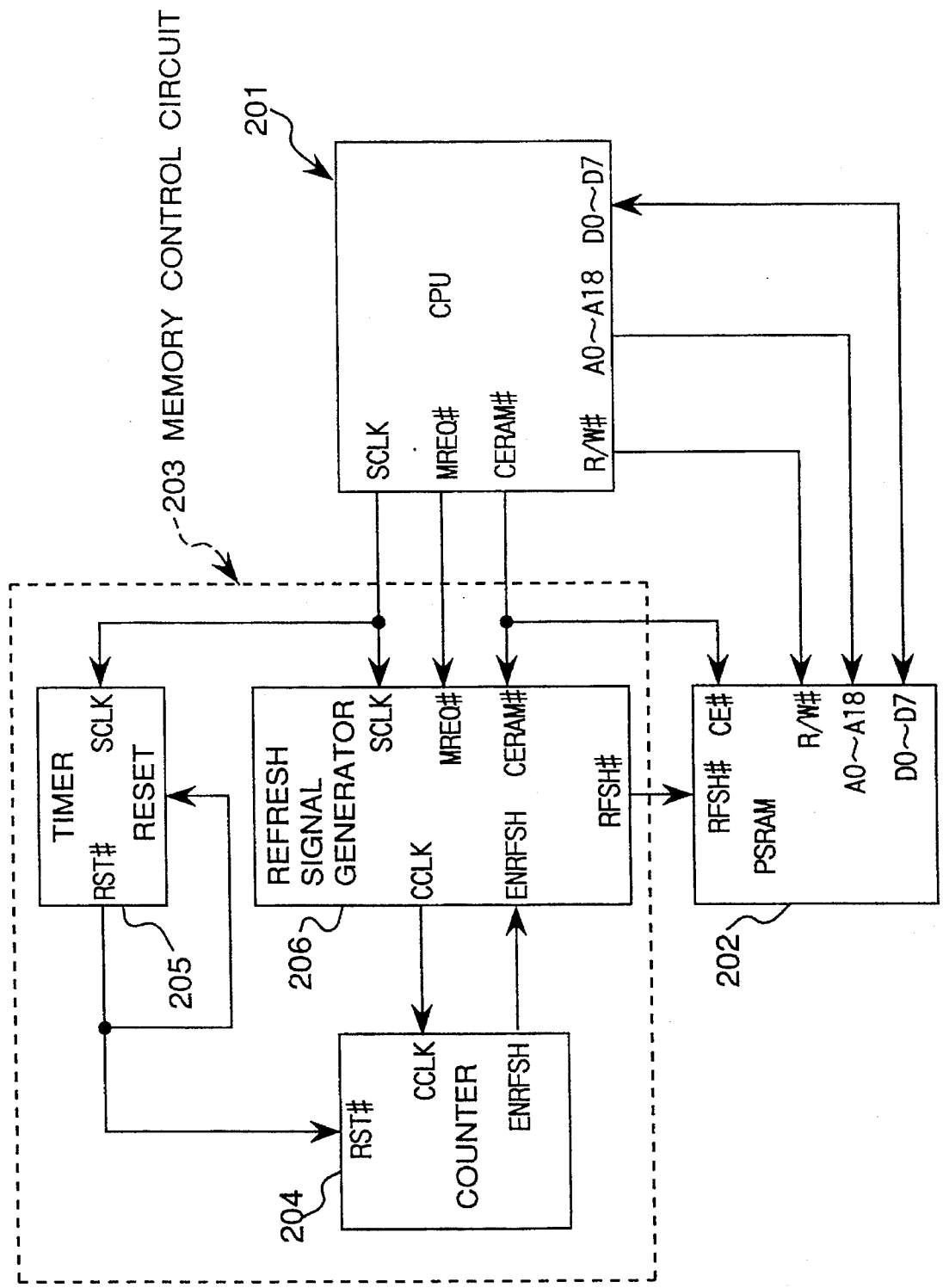
FIG. 6 is a diagram showing the arrangement of the information processing apparatus according to a third embodiment of the present invention.

FIG. 6 shows the general construction of the information processing apparatus according to a third embodiment of the present invention. This information processing apparatus comprises a CPU 201, PSRAM 202, and a memory control circuit 203. The memory control circuit 203 can be regarded as a peripheral circuit of the CPU 201 and the PSRAM 202, both forming the basis of the system. The memory control circuit 203 is composed of a refresh signal generator 206, a counter 204, and a timer 205.

The CPU 201 outputs a system clock SCLK having an oscillation frequency of 3 MHz, an execution-cycle reference signal MREQ#, a chip-enable signal CERAM# representing whether or not the PSRAM is accessed, a read/write control signal R/W# representing that read or write operation is executed, and address signals A0 to A18, while it inputs and outputs data signals D0 to D7. The chip-enable signal CERAM# represents that the PSRAM 202 is accessed when it is at "L" level, and that the PSRAM 202 is not accessed when it is at "H" level.

The timer 205, receiving the system clock SCLK from the CPU 201, counts time by directly counting this system clock SCLK, and outputs a reset signal RST# for resetting the count values of the timer 205 itself and the counter 204. The reset signal RST# is inputted to the timer 205 itself and the counter 204. In more detail, when the timer 205 counts up the time of a previously set first set period (14 msec in this case), it temporarily holds the signal RST# active ("L"). When the signal RST# becomes active, the counter 204 is reset back to 0 while the timer 205 itself is also reset. It is noted that 14 msec corresponds to a time duration in which the system clock SCLK with oscillation frequency 3 MHz is counted 42000 times.

Figure 9:
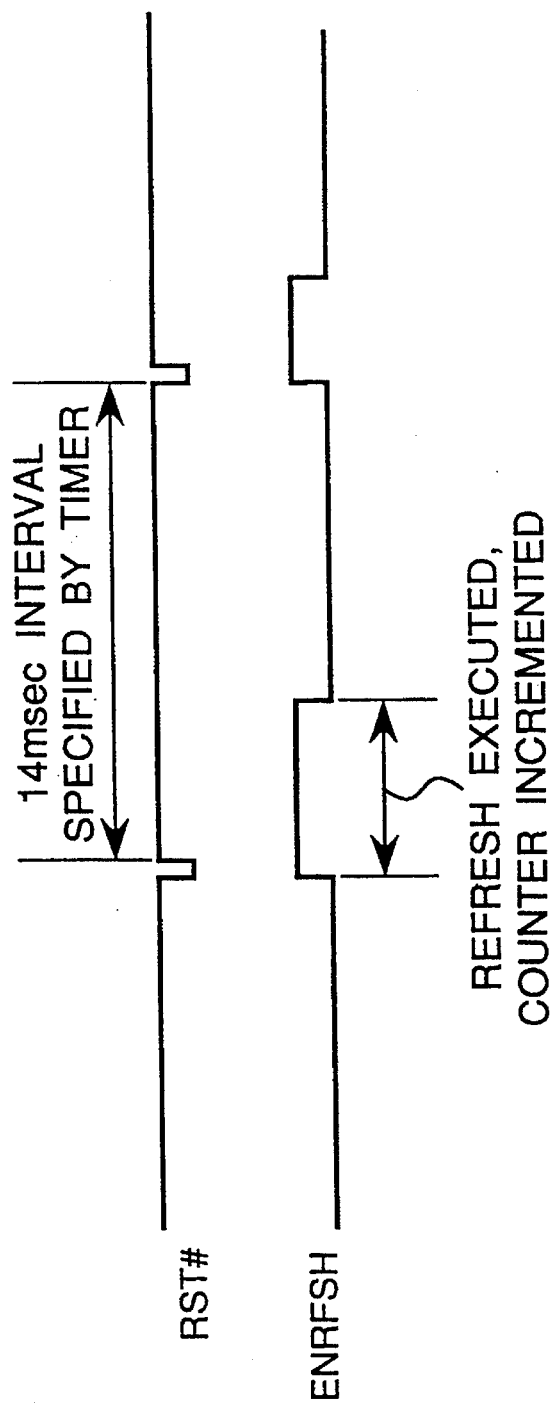
FIGS. 9A, 9B are each a diagram showing transitions of each signal in the information processing apparatus of FIG. 6.

The counter 204 outputs a refresh enable/halt instruction signal ENRFSH for instructing execution or halt of refresh, to the refresh signal generator 206. As shown in FIGS. 9A, 9B, the counter 204 makes the refresh enable/halt instruction signal ENRFSH an "H" (enable instruction) at a time point when the counter 204 is reset by the reset signal RST# from the timer 205. Also, the counter 204 increments by the number of pulses upon receiving a count clock CCLK outputted by the refresh signal generator 206 (FIG. 6). Then, after the counter 204 has reached a necessary number of refreshes, 2048 (later described), the counter 204 makes the refresh enable/halt instruction signal ENRFSH an "L" (halt instruction).

The refresh signal generator 206 operates by referencing the system clock SCLK and the execution-cycle reference signal MREQ# outputted by the CPU 201, and creates the refresh signal RFSH# representing whether or not the PSRAM 202 is refreshed, outputting it to the PSRAM 202. If the refresh enable/halt instruction signal ENRFSH outputted by the counter 204 is an "H" and the chip-enable signal CERAM# from the CPU 201 is an "H", then the refresh signal generator 206 makes the refresh signal RFSH# an "L" (active level). Also, the refresh signal generator 206 outputs a half-cycle "H" pulse as a number-of-times-of-refresh count clock CCLK each time refresh is performed once. Meanwhile, if the refresh enable/halt instruction signal ENRFSH is an "L" (halt instruction), or if the chip-enable signal CERAM# from the CPU 201 is an "L", then the refresh signal generator 206 halts any refresh operation to the PSRAM 202. In other words, the refresh signal generator 206 maintains the refresh signal RFSH# at "H" (inactive level).

The PSRAM 202 has a CE# terminal for receiving a chip-enable signal CERAM# from the CPU 201, an R/W# terminal for receiving a read/write control signal, and address input terminals A0 to A18 for receiving an address signal, while it has data input/output terminals D0 to D7 for inputting and outputting data signals. The PSRAM 202 further has an RFSH# terminal for receiving a refresh signal from the refresh signal generator 206. The PSRAM 202 is assumed to comply with a refresh specification of 2048 times/32 msec. Accordingly, 2048 times of refresh operations are required for all the stored data to be refreshed completely.

Figure 10:
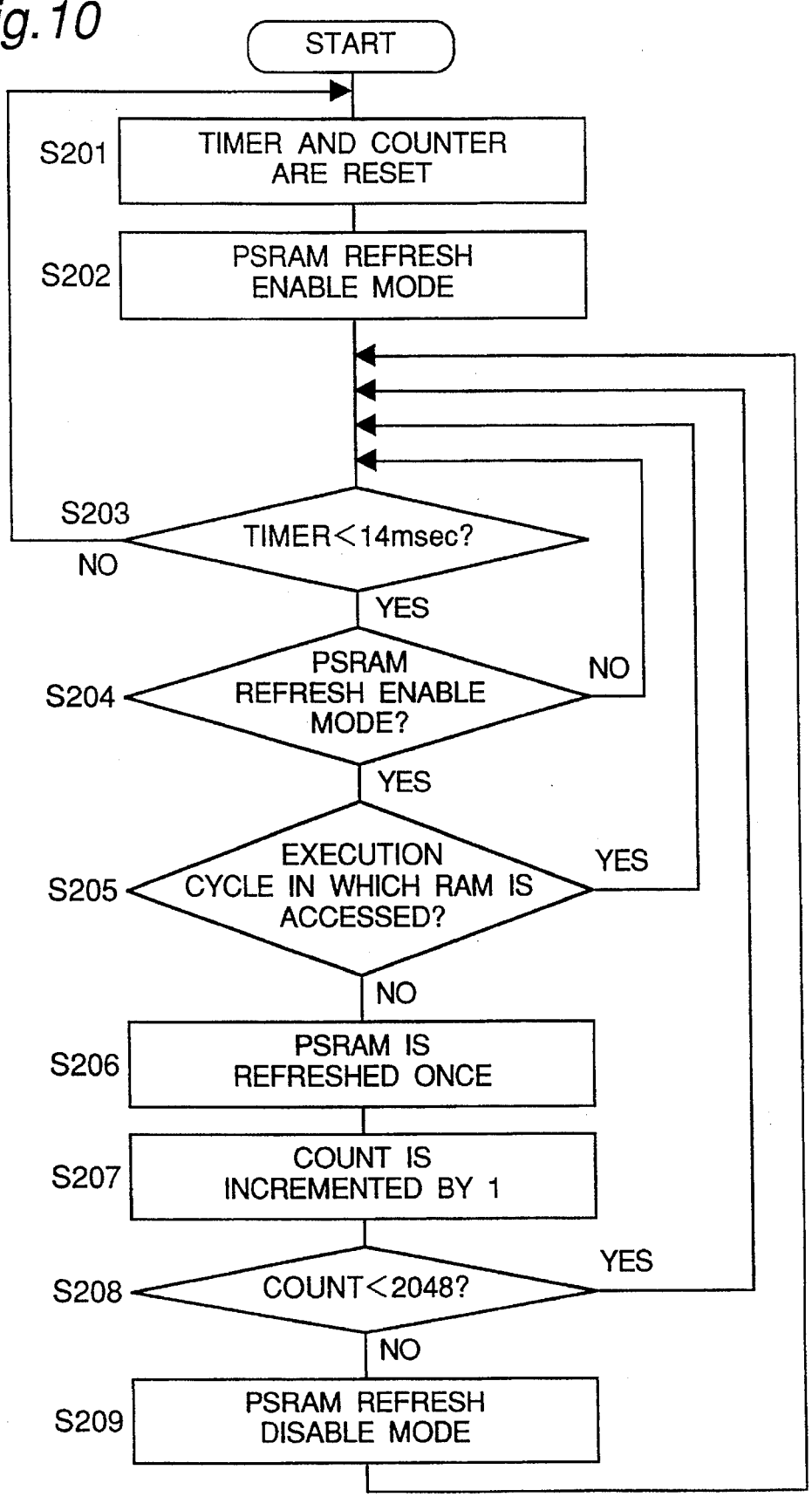
FIG. 10 is a diagram showing the flow chart for explaining the operating procedure of the information processing apparatus of FIG. 6.

This information processing apparatus operates according to the flow as shown in FIG. 10.

It is noted beforehand that as shown in FIGS. 7A, 7B, 7C, ..., 7H, one execution cycle of the CPU 201 consists of two periods of the system clock SCLK, which fact remains unchanged even when the execution cycle is a CPU's internal processing cycle or a cycle in which RAM or some external device other than RAM is accessed (external device access cycle). In an external device access cycle, the execution-cycle reference signal MREQ# holds active ("L") only for a time interval of one cycle of the system clock SCLK corresponding to a second half of one execution cycle. Therefore, the refresh signal generator 206 can obtain various points of timing (shown by vertical broken lines in FIG. 7A, 7B, 7C, ..., 7H), which delimit CPU execution cycles, from the reference signal MREQ# and the system clock SCLK.

(1) First, the timer 205 and the counter 204 are reset (S201). The counter 204 makes the refresh enable/halt instruction signal ENRFSH an "H" (enable instruction) at a time point when the counter 204 is reset by the reset signal RST# derived from the timer 205. As a result, the refresh signal generator 206 is satisfied with one of the requirements for making the refresh signal RFSH# an "L" (active level). This leads to a mode in which the PSRAM 202 can be refreshed (S202).

Figure 7:
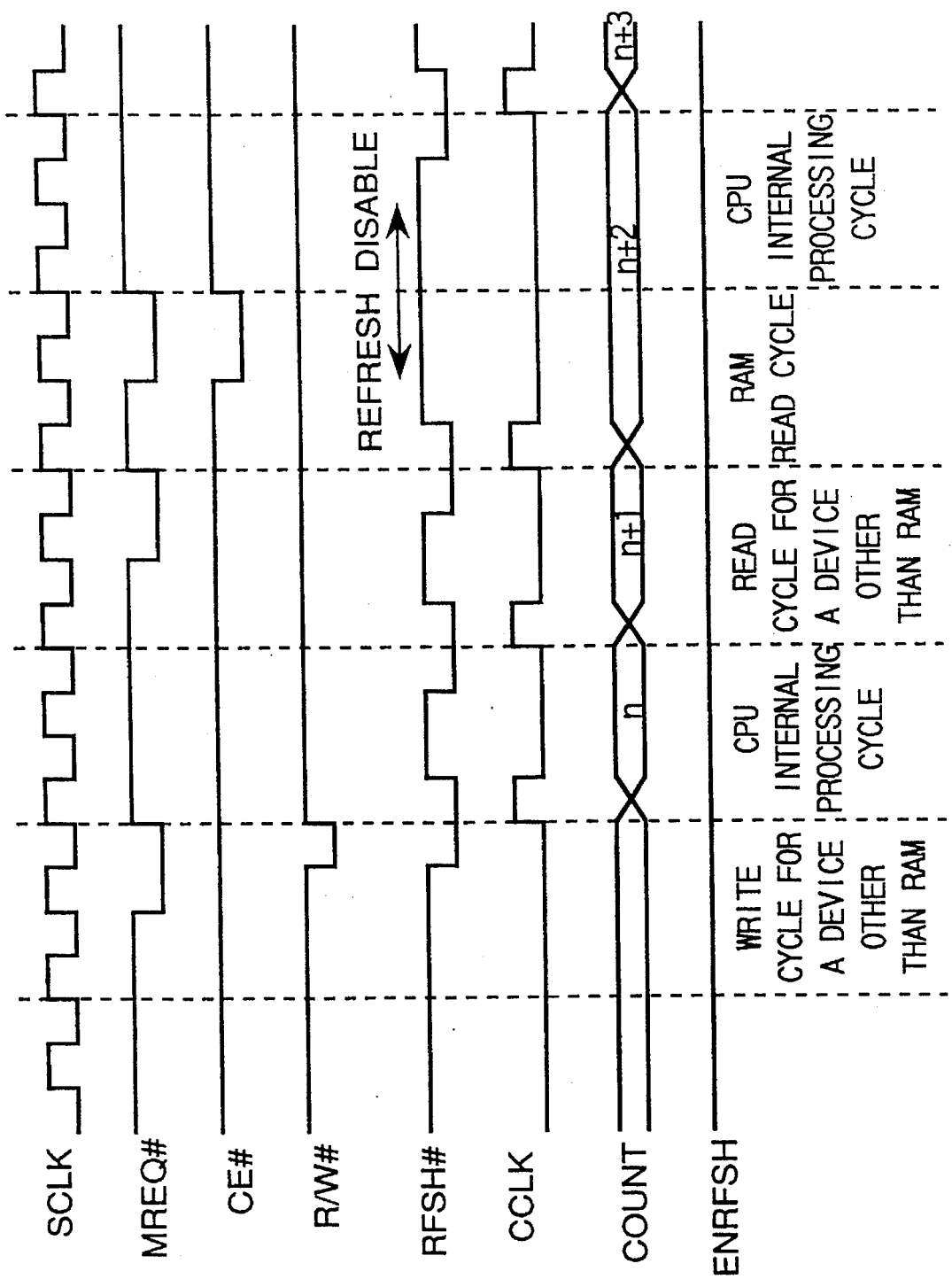
FIGS. 7A, 7B, 7C, . . . , 7H are each a diagram showing transitions of each signal in the information processing apparatus of FIG. 6.

(2) At this point, if the count of the timer 205 is less than 14 msec (S203), if the mode is one in which PSRAM can be refreshed (S204), and if the cycle is one other than the execution cycle involving access to the RAM (read cycle) (S205), then the refresh signal generator 206 executes refresh of the PSRAM 202 by holding the refresh signal RFSH# at active level (S206). That is, if the refresh enable/halt instruction signal ENRFSH is an "H" and the chip-enable signal CERAM# is an "H", then the refresh signal generator 206 makes the refresh signal RFSH# an "L" so that the PSRAM 202 is refreshed. In more detail, as shown in FIGS. 7A, 7B, 7C, ..., 7H, the refresh signal generator 206 assigns to the refresh of the PSRAM 202 the period of one cycle of the system clock SCLK including the timing points that delimit CPU execution cycles (shown by broken lines), and holds the refresh signal RFSH# active ("L") throughout the period, whereby the PSRAM 202 is refreshed (S206).

Meanwhile, in an execution cycle in which the CPU 201 accesses the PSRAM 202 (read cycle), the refresh at step S205 is disabled (the program returns to step S203; alike also when the requirement of step S204 is not satisfied). This is because the CPU 201 holds the chip-enable signal CERAM# active ("L") for the period of one cycle of the system clock SCLK corresponding to the second half of the RAM read cycle, and because the refresh signal generator 206 holds the refresh signal RFSH# at "H" for the same period and its subsequent period of one cycle of the system clock SCLK. In addition, immediately before the chip-enable signal CERAM# goes active ("L"), there is no control based on the chip-enable signal CERAM#. Therefore, the timing at which the refresh signal RFSH# is made to go active ("L") is delayed so that it goes active ("L") at a delimiter of an execution cycle immediately after a refresh. This arrangement prevents access to the PSRAM from taking place immediately after a refresh.

(3) Each time refresh is performed once, the refresh signal generator 206 outputs a half-cycle "H" pulse as the number-of-times-of-refresh count clock CCLK. The counter 204 increments the count clock CCLK.

(4) As described before, 2048 times of refresh operations are required for all stored data of the PSRAM 202 to be refreshed completely. Therefore, if the counter 204 has not reached the necessary number of refreshes, 2048 (S208), then the program returns to the step S203 and repeats the processing of steps S203 through S207.

Figure 8:
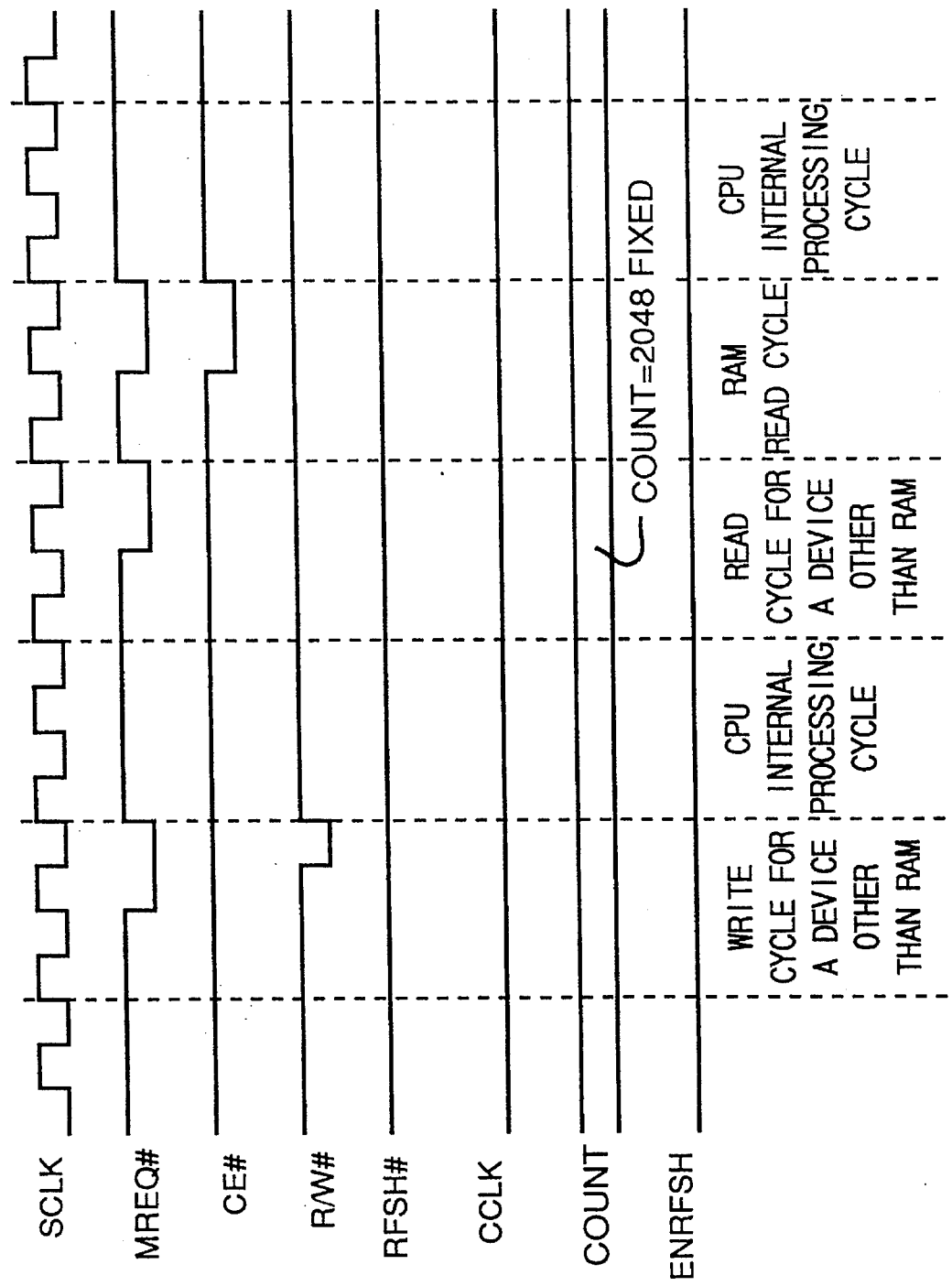
FIGS. 8A, 8B, 8C, . . . , 8H are each a diagram showing transitions of each signal in the information processing apparatus of FIG. 6.

Meanwhile, when the counter 204 has reached the necessary number of refreshes, 2048, at step S208, the counter 204 makes the refresh enable/halt instruction signal ENRFSH an "L" (halt instruction), disabling refresh of the PSRAM 202 (S209). After the refresh enable/halt instruction signal ENRFSH has become "L" (halt instruction) at step S204, the refresh signal generator 206 entirely halts any refresh operation to the PSRAM 202. In other words, as shown in FIG. 8E, the refresh signal generator 206 holds the refresh signal RFSH# for the PSRAM 202 as it is at "H" . Since the refresh is not performed, the refresh signal generator 206 generates no pulse of count clock CCLK and therefore the counter 204 is not incremented.

(5) The PSRAM 202 is so arranged as to comply with the refresh specification of 2048 times/32 msec. This gives rise to a need of control for resuming refresh after the counter 204 has counted up the necessary number of refreshes, 2048, with the refresh temporarily halted.

Thus, after the refresh of the PSRAM 202 is disabled (S209), the program returns to step S203. Then, when the timer 205 has counted 14 msec, the timer 205 makes the reset signal RST# temporarily active ("L"), whereby the timer 205 and the counter 204 are reset. As a result, the processing of steps S201 through S209 is repeated so that necessary refreshes are executed on the PSRAM 202.

As seen above, this information processing apparatus performs refresh in synchronization with the execution-cycle reference signal MREQ# in a cycle other than the execution cycle involving access to the RAM (read cycle), without the provision of an execution cycle for exclusive use of refresh. Accordingly, the PSRAM can be refreshed without deteriorating the CPU processing efficiency. Also, in access to the PSRAM 202, there will not occur such malfunction as would destroy data due to competition of refresh, so that the refresh can be performed properly. Further, after the necessary number of refreshes has been counted up, refresh will not be performed until a reset. Accordingly, excessive refreshes will never be executed, as compared with the data hold specification of the PSRAM. As a result, electric current consumption can be suppressed.

(Fourth Embodiment)

Figure 11:
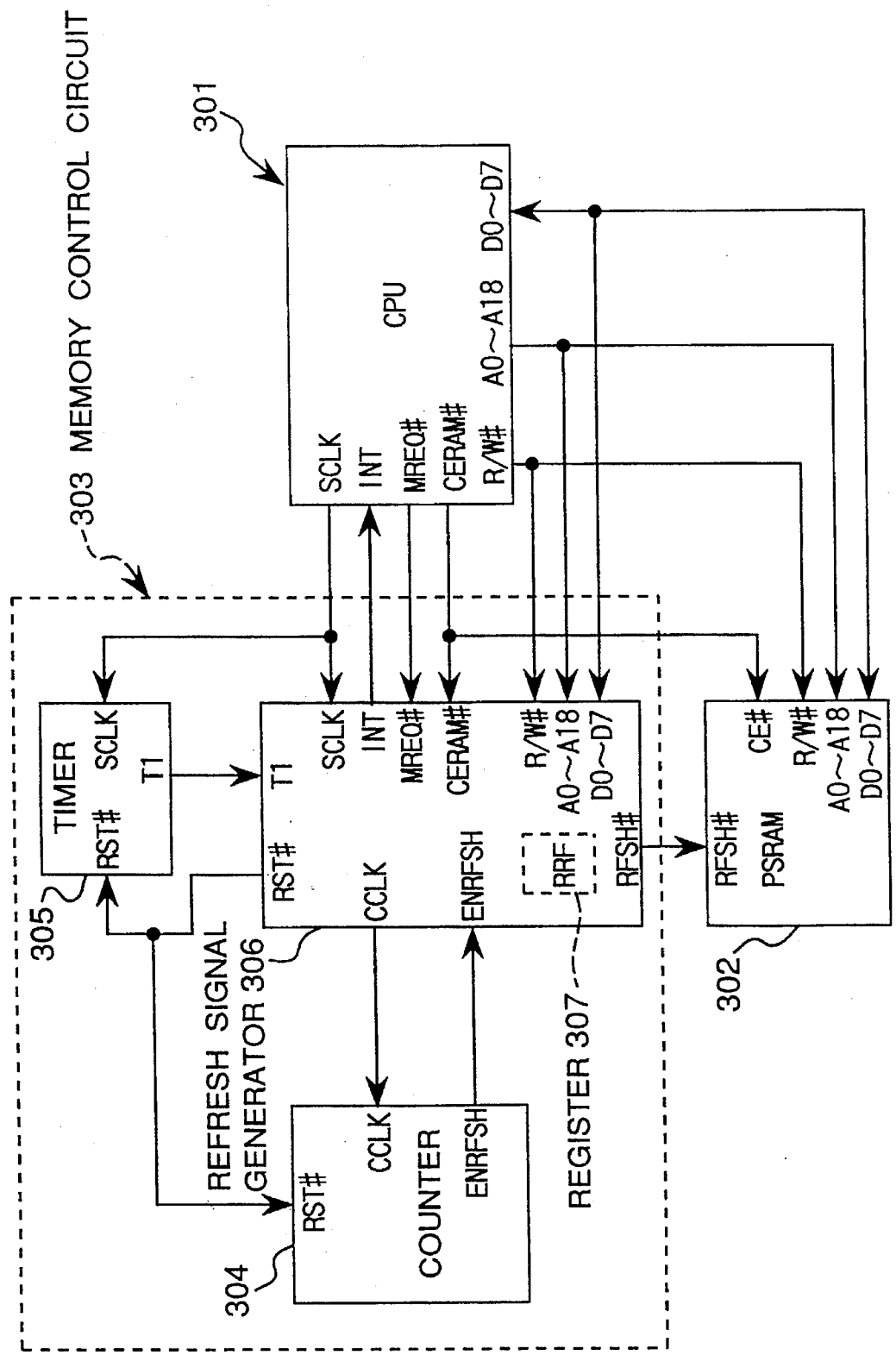
FIG. 11 is a diagram showing the arrangement of the information processing apparatus according to a fourth embodiment of the present invention.

FIG. 11 shows the general construction of the information processing apparatus according to a fourth embodiment of the present invention. This information processing apparatus, which is a modification of the information processing apparatus of the third embodiment, comprises a CPU 301, PSRAM 302, and a memory control circuit 303. The memory control circuit 303 can be regarded as a peripheral circuit of the CPU 301 and the PSRAM 302, both forming the basis of the system. The memory control circuit 303 comprises a refresh signal generator 306, a counter 304, and a timer 305. In FIG. 11, reference numerals for components corresponding to those of FIG. 6 are incremented by 100.

The present information processing apparatus differs from that of the third embodiment first in that the signal RST# for resetting the count values of the timer 305 and the counter 304 is not outputted directly from the timer 305, but created by the refresh signal generator 306 and inputted to the timer 305 and the counter 304. The timer 305 outputs a first reset signal T1 for notifying that it has counted up a previously set first set period (14 msec in this case). The refresh signal generator 306, receiving the signal T1 from the timer 305, immediately outputs a reset signal RST#.

Also, the refresh signal generator 306 contains a register 307 having a value that reflects the level ("H" or "L") of the refresh enable/halt instruction signal ENRFSH from the counter 304. The register 307 is so arranged as to be set to "1" when the enable/halt instruction signal ENRFSH is an "H" (enable instruction), and to "0" when the enable/halt instruction signal ENRFSH is an "L" (halt instruction). The refresh signal generator 306 has an R/W# terminal for receiving a read/write control signal from the CPU 301 for reading the above set value of the register 307, address terminals A0 to A18 for receiving an address signal, and data input/output terminals D0 to D7. Also, the refresh signal generator 306 can output to the CPU 301 an interrupt request signal INT for requesting execution of an interrupt program when the refresh enable/halt instruction signal ENRFSH from the counter 304 is an "H" (enable instruction), upon reception of the signal T1 from the timer 305.

Further, the CPU 301 temporarily suspends the currently executed program at a time point when it receives the interrupt request signal INT from the refresh signal generator 306. Instead, the CPU 301 executes an interrupt program for executing a process other than accessing the PSRAM 302.

Figure 13:
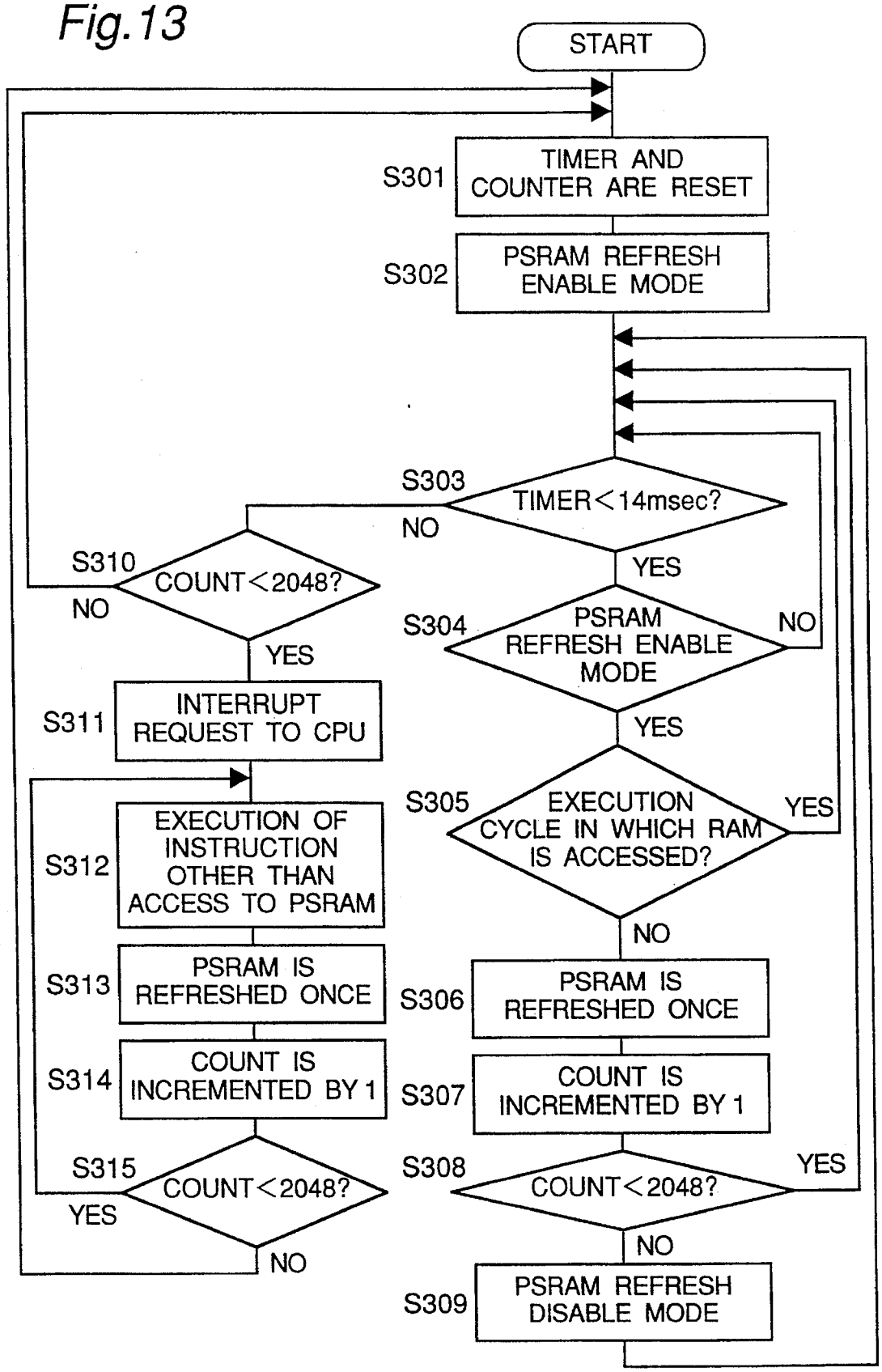
FIG. 13 is a diagram showing the flow chart for explaining the operating procedure of the information processing apparatus of FIG. 11.

The operation of this information processing apparatus is carried out according to the flow as shown in FIG. 13.

Operations of step S301 through S309 are the same as those of steps S201 through S209 in the third embodiment. The difference from the third embodiment is that when the timer 305 has counted up the first set period (14 msec) at step S303, the timer 305 and the counter 304 are not reset immediately, but the processing of steps S310 through S315 described below is executed.

Figure 12:
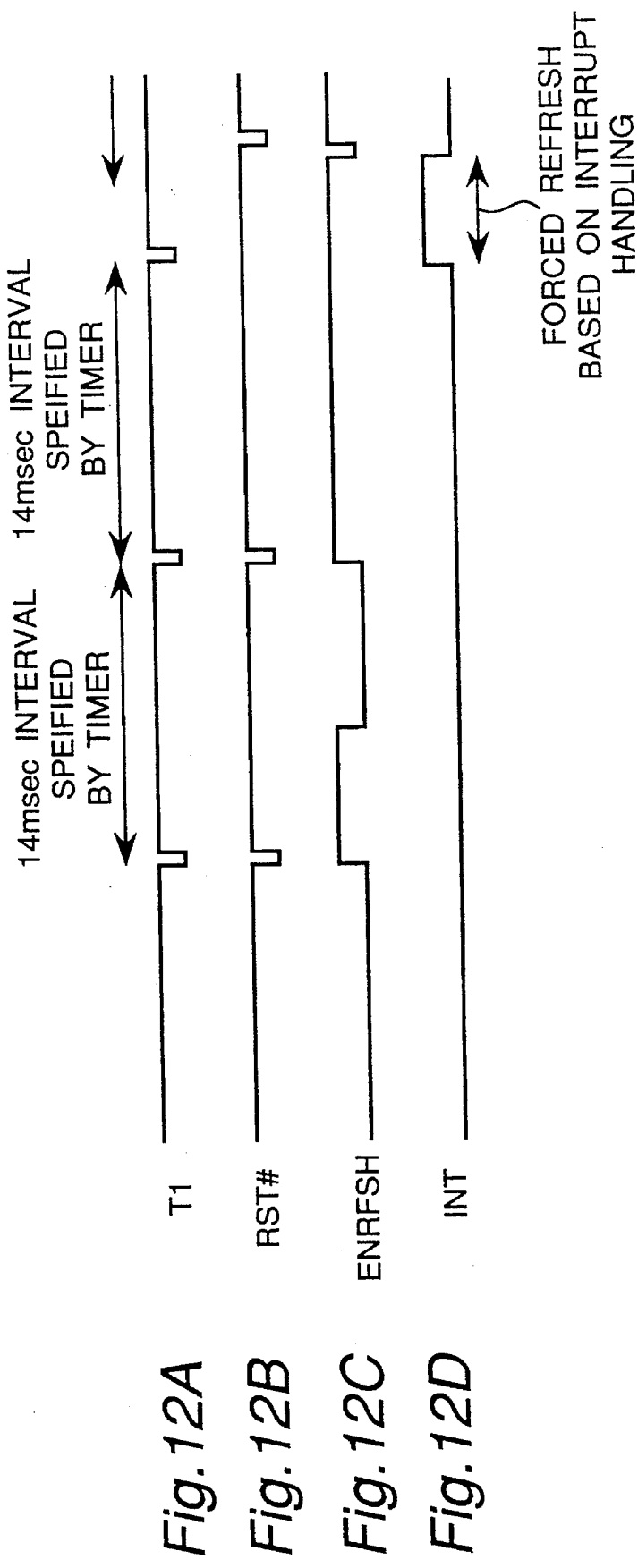
FIGS. 12A, 12B, 12C 12D are each a diagram showing transitions of each signal in the information processing apparatus of FIG. 11.

(1) When the timer 305 has counted 14 msec at step S303, the timer 305 makes the signal T1 temporarily active ("L") as shown in FIGS. 12A, 12B, and 12C. At this point, if the counter 304 has already reached a value of 2048 (S310), the counter 304 makes the refresh enable/halt instruction signal ENRFSH an "L" (halt instruction). As a result, the refresh signal generator 306 makes the reset signal RST# temporarily active ("L"), whereby the program returns to step S301 so that the timer 305 and the counter 304 are reset. It is noted that this operation has no difference from that of the third embodiment as seen from the PSRAM 302.

Meanwhile, if the counter 304 has not yet reached the value of 2048 at step S310, the counter 304 makes the refresh enable/halt instruction signal ENRFSH an "H" (enable instruction). As a result, the refresh signal generator 306 holds the reset signal RST# as it is inactive ("H"), in which case neither the timer 305 nor the counter 304 is reset. Instead, the interrupt request signal INT is made active ("H") and an interrupt request for the CPU 301 is made (S311).

(2) The CPU 301 temporarily suspends the currently executed program at a time point when an interrupt request is issued from the refresh signal generator 306, and then executes the next program (S312).

More specifically, when the interrupt request signal INT goes active ("H" ), the CPU 301 reads the set value of the register 307 provided in the refresh signal generator 306. At this point, since the refresh enable/halt instruction signal ENRFSH is an "H", the register 307 is set at "1".

Actually, the CPU 301 designates a unique address assigned to the register 307, and simultaneously sets the read/write control signal R/W# to the read mode. The refresh signal generator 306 decodes an input address, where if it is coincident with the address value unique to the register 307 and the read/write control signal R/W# is set to the read mode, then the refresh signal generator 306 outputs the set value of the register 307 to the data input/output terminals D0 to D7. As a result, the CPU 301 obtains a value of the register 307, "1".

(3) Since at least one execution cycle is spent to carry out the operation of reading the value of the register 307 and yet no access to the PSRAM is made in the execution cycle (S312), the chip-enable signal CERAM# is held at "H". Accordingly, the refresh signal generator 306 performs refresh of the PSRAM 302 once during the cycle period (S313), where the counter 304 is incremented by one (S314). While the value of the counter 304 is less than 2048 (S315) and therefore the refresh enable/halt instruction signal ENRFSH is an "H" and the value of the register 307 read by the CPU 301 is "1" this sequence of processes (S312 to S315) are repeated.

(4) When the refreshes necessary for the PSRAM 302 are completed and the counter 304 has reached the value of 2048 (S315), the refresh enable/halt instruction signal ENRFSH goes "L" and the register 307 also changes to "0". When obtaining a "0" by reading the set value of the register 307, the CPU 301 ends the execution of the interrupt program and resumes the temporarily suspended program that had been executed before the event of the interrupt. On the other hand, the refresh signal generator 306, awaiting a time elapse for the CPU 301 to read the value of the register 307, "0", i.e., awaiting one execution cycle (corresponding to two periods of system clock SCLK), makes active ("L") the signal RST# that resets the count values of the timer 305 and the counter 304, whereby the timer 305 and the counter 304 are reset (S301). Thereafter, the processes including and succeeding the step S301 are repeated, whereby refreshes necessary for the PSRAM 302 are executed.

As seen above, this information processing apparatus performs refresh in synchronization with the execution-cycle reference signal MREQ# in a cycle other than the execution cycle in which the RAM is accessed (read cycle), without the provision of an execution cycle for exclusive use of refresh. Accordingly, PSRAM can be refreshed without deteriorating the CPU processing efficiency.

In addition, if the set period of the timer 305 (14 msec in the above case) is less than one half of the refresh specification for the PSRAM 302, then refresh can be performed within the specified range whatever conditions the access to the PSRAM 302 is subject to. In other words, for control of the PSRAM 302 whose refresh cycle is specified as 2048 times/32 msec, the timer 305 may properly be set to a time interval shorter than 16 msec.

Actually, the timer 305 makes active ("L") the signal T1 that notifies the count-up of the first set period, 14 msec, at a stage that the system clock SCLK has been counted over 42000 times. With such arrangement, even if there is no access to the PSRAM 302 for the first-time 14 msec, where 2048 times of refresh is completed in early stage of this set period, and if accesses to the PSRAM 302 have succeeded without rest in the subsequent second-time 14 msec period, where the refresh will not be performed until the event of an interrupt handling after the elapse of the second-time 14 msec period, yet the period from when refresh is performed once until when refresh is performed next time on the same memory area is at most 28 msec or less, which is a double of 14 msec, so as to fall within 32 msec, which is the manufacturer's specification. Accordingly, it is ensured that refresh is performed within the refresh cycle specified for the PSRAM. As a result, storage data of the PSRAM can be securely maintained.

As seen above, in this information processing apparatus, if the refresh of the PSRAM 302 has not been finished completely at a time point when the first set period, 14 msec, expires, then the original program is temporarily suspended and an interrupt program for executing a process other than accessing the PSRAM 302 is executed so that the refresh of the PSRAM 302 is enabled. Thus, the PSRAM 302 can be properly refreshed without any shortage.

(Fifth Embodiment)

Figure 14:
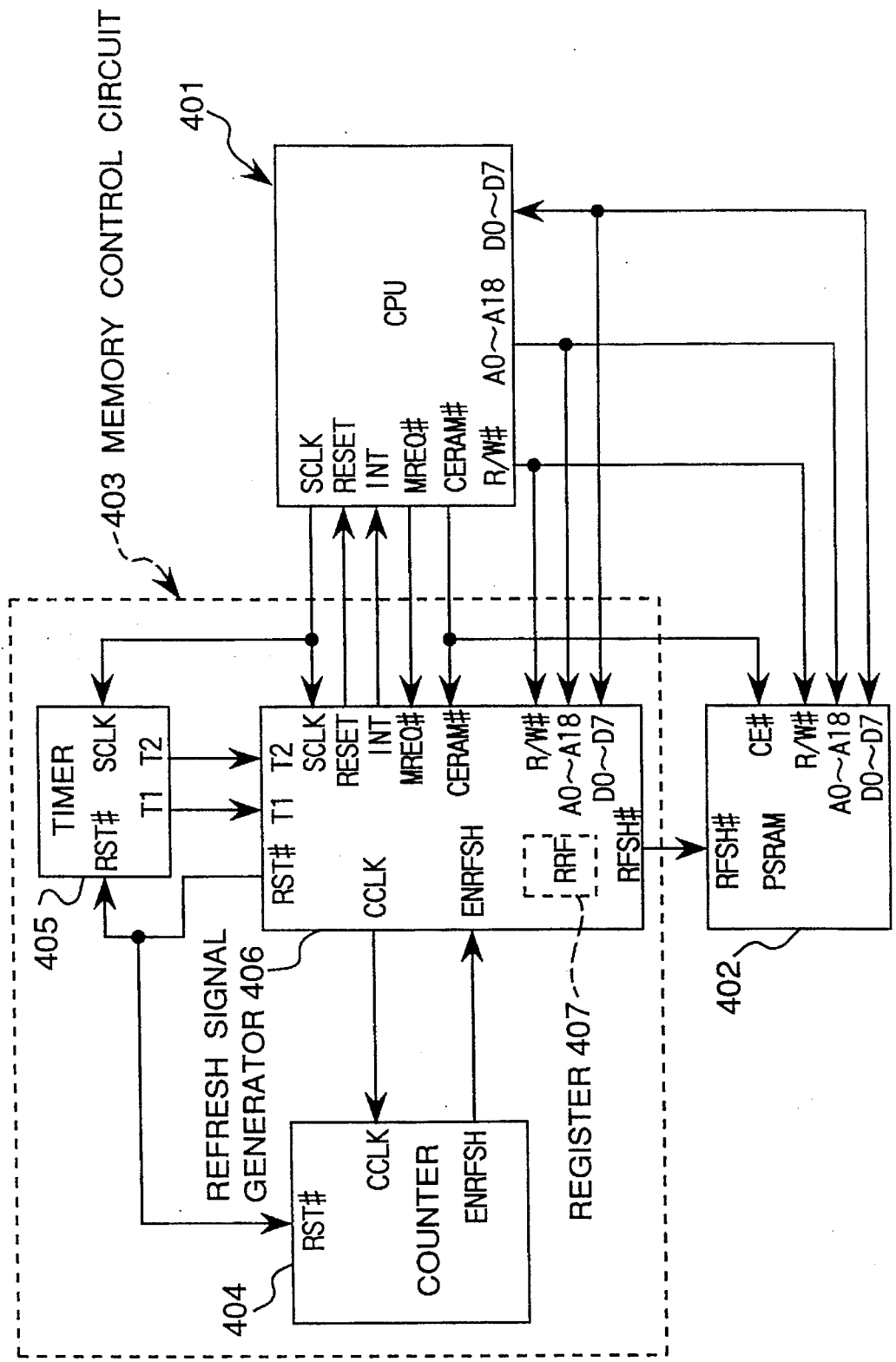
FIG. 14 is a diagram showing the arrangement of the information processing apparatus according to a fifth embodiment of the present invention.
Figure 16:
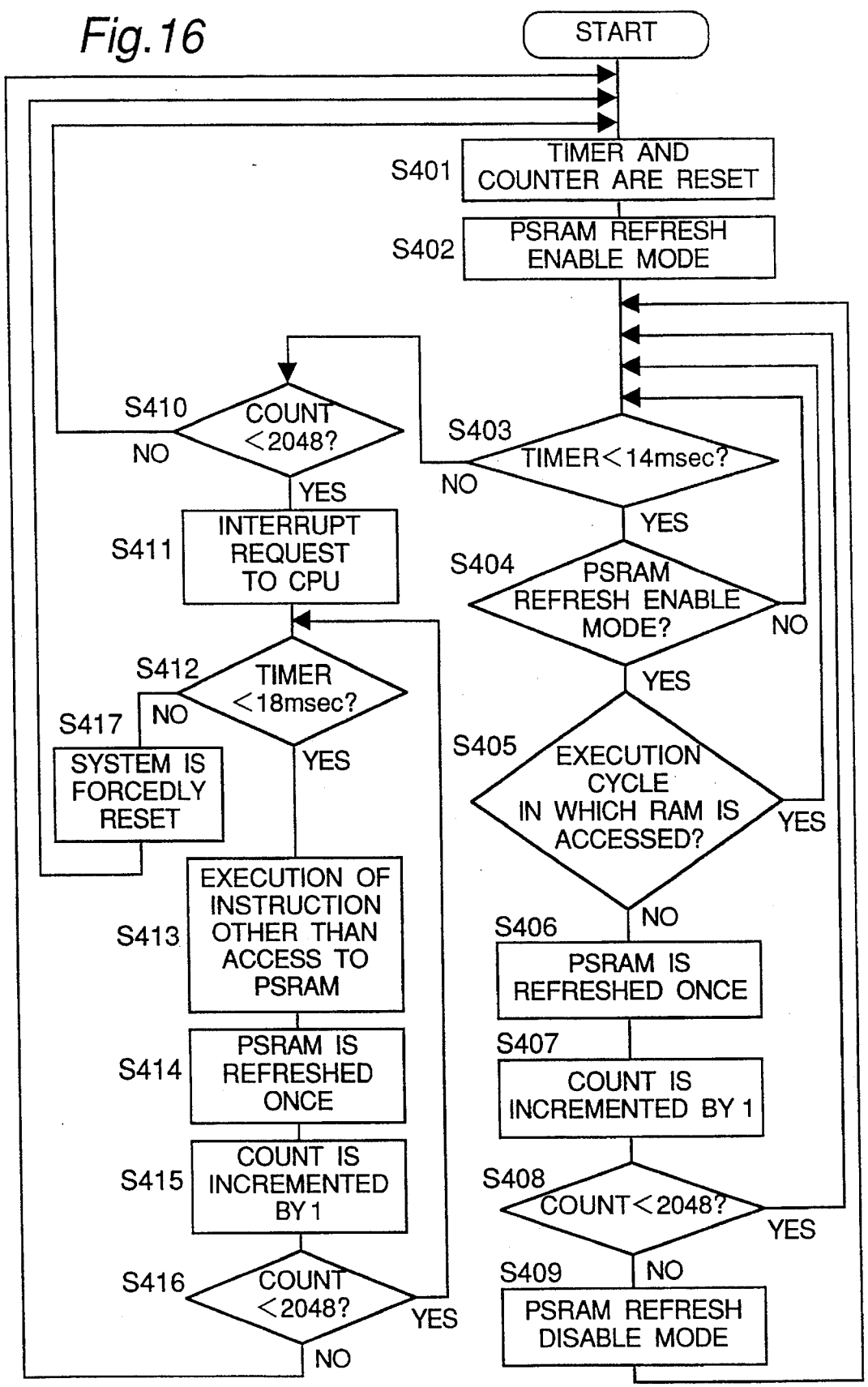
FIG. 16 is a diagram for explaining the operating procedure of the information processing apparatus of FIG. 14.
Figure 18:
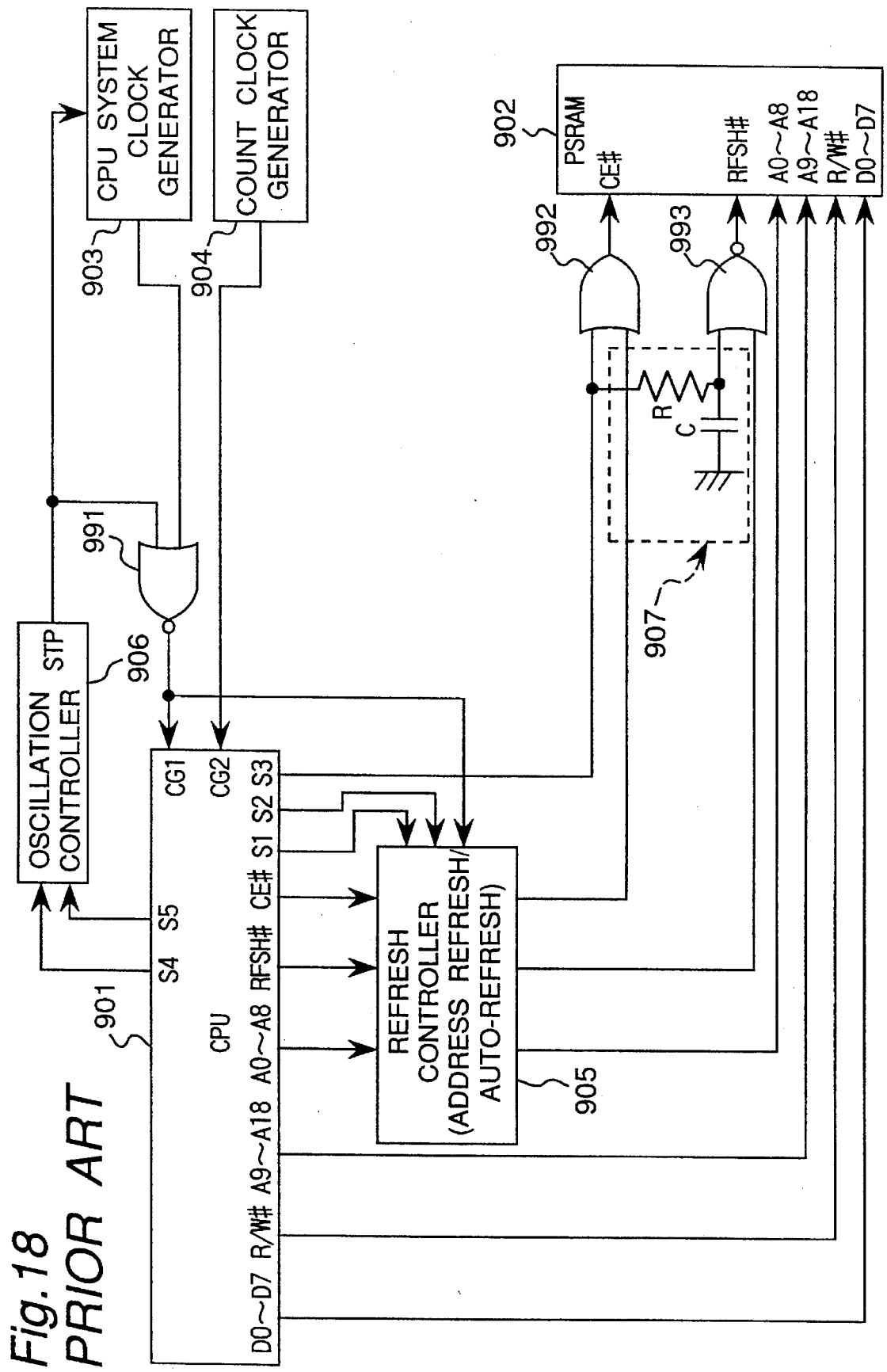
FIG. 18 is a diagram showing the arrangement of the conventional system.

FIG. 14 shows the general construction of the information processing apparatus according to a fifth embodiment of the present invention. This information processing apparatus, which is a modification of the information processing apparatus of the fourth embodiment, comprises a CPU 401, PSRAM 402, and a memory control circuit 403. The memory control circuit 403 can be regarded as a peripheral circuit of the CPU 401 and the PSRAM 402, both forming the basis of the system. The memory control circuit 403 comprises a refresh signal generator 406, a counter 404, and a timer 405. In FIG. 14, reference numerals for components corresponding to those of FIG. 11 are incremented by 100.

The present information processing apparatus differs from that of the fourth embodiment in that the timer 405 outputs both a first reset signal T1 for notifying that a first set period (14 msec in this case) has been counted up, and a second reset signal T2 for notifying that a second set period (18 msec in this case) has been counted up. The refresh signal generator 406, receiving the signal T2 from the timer 405, immediately outputs a reset signal RESET to the CPU 401. Also, the CPU 401, receiving the reset signal RESET from the refresh signal generator 406, immediately moves to a previously set initial program. This initial program has the description of groups of instructions executable irrespectively of circuit states. The CPU 401, having moved to the initial program, initializes all the circuit states so that it can be freed from any runaway of software.

The operation of this information processing apparatus is carried out according to the flow as shown in FIG. 13.

Operations of steps S401 through S411 and S413 through S415 are the same as those of steps S301 through S311 and S312 through S314 in the fourth embodiment respectively. The difference from the fourth embodiment is that if an interrupt program is not properly executed for some abnormality after the refresh signal generator 406 has made an interrupt request to the CPU 401 at step S311, so that a necessary number of times of refreshes based on the interrupt program are not performed, then the processing of steps S412, S417 described below, i.e., the process of moving the CPU 401 to the initial program is carried out.

(1) If the program has been carried out normally until the event of an interrupt request to the CPU 401 (S411), then the CPU 401 temporarily suspends the currently executed program at a time point when the interrupt request is issued from the refresh signal generator 406. The CPU 401 then executes an interrupt program previously determined to be executed in the event of an interrupt request, and executes refresh necessary for the PSRAM 402. However, at the time of the interrupt request, if there is some cause, such as a software bug, that has resulted in a collapse of circuit conditions or the like that should be placed as a basis of the interrupt program, then the interrupt program could not be executed correctly so that the system might result in a so-called runaway of software. In the worst case, there is a danger that the PSRAM 402 may be left without being refreshed at all. Thus, as a countermeasure for such cases, even after the timer 405 has counted up the first set period with the signal T1 active ("L"), the timer 405 is made to continue counting time. Then, as shown in FIGS. 15A, 15B, after the signal T1 has become active, the timer 405 makes the signal T2 active ("L") when it counts up the second set period (18 msec) (S412).

The second set period (18 msec) is determined based on the following grounds. If there is no runaway of software or the like so that the interrupt program based on the interrupt request is normally executed, then the PSRAM 402 is refreshed once per execution cycle of CPU as described before. In this process, if the PSRAM 402 is refreshed up to 2048 times, the execution of the interrupt program is ended and the timer 405 and the counter 404 are reset. The time required to execute the interrupt program is 2048 times longer than the execution cycle, corresponding to 4096 periods of the system clock SCLK (one execution cycle corresponds to two periods of the system clock SCLK in this case). If the interrupt program is executed normally, refresh of the PSRAM 402 will necessarily be completed by the time the timer 405 counts the system clock SCLK up to 4096 times after the signal T1 has become active. Thus, the setting is such that after the signal T1 has become active, when the timer 405 counts up 4096 times of the system clock SCLK, or 5000 times of it (18 msec) in this case, the signal T2 goes active. As far as the system operates normally, the signal T2 will never go active. Conversely, if the signal T2 has become active, the system can be regarded as having resulted in an abnormal state such as a runaway of software.

(2) When the signal T2 has become active, the refresh signal generator 406 immediately makes the reset signal RESET active ("H"), resetting the CPU 401 (step S417). The CPU 401, after reset, executes a previously set initial program. The initial program has the description of groups of instructions executable irrespectively of circuit states. The CPU 401 initializes all the circuit states so that it is freed from the state of the runaway of software. As a result, the operation for refresh of the PSRAM 402 can be returned to normal state.

As seen above, in this information processing apparatus, if an interrupt program is not executed correctly due to some abnormality, the CPU 401 can be moved to the initial program and thereby returned to normal operation, by counting the second set period by the timer 405. As a result, refresh necessary for the PSRAM 402 to maintain data can be carried out properly.

As is clear from the foregoing description, in the information processing apparatus of the first embodiment, when the system clock generator comes to an oscillation halt, the output of the self-refresh setter is inverted in a certain time elapse. The logic circuits latch the chip-enable signal inputted to the chip-enable terminal of the PSRAM at a level representing that the PSRAM is not accessed, and the refresh signal inputted to the refresh terminal of the PSRAM at a level representing that the PSRAM is refreshed, respectively, in a certain time elapse since the oscillation halt of the system clock generator based on the output of the self-refresh setter. As a result, the PSRAM can be set to the self-refresh mode in a certain time elapse since the oscillation halt of the system clock generator. Accordingly, even when the system clock generator comes to an abnormal halt, storage contents of the PSRAM can be maintained.

In the information processing apparatus of the second embodiment, when the power supply voltage becomes lower than a reference value, the voltage detector produces an output signal representing so. The CPU latches the chip-enable signal inputted to the chip-enable terminal of the PSRAM at a level representing that the PSRAM is not accessed, and the refresh signal inputted to the refresh terminal of the PSRAM at a level representing that the PSRAM is refreshed, respectively, based on the output signal of the voltage detector. As a result, the PSRAM can be set to the self-refresh mode in a certain time elapse. Accordingly, even when the system clock generator comes to an abnormal halt, storage contents of the PSRAM can be maintained.

In the information processing apparatus of the third embodiment, since refresh is performed in synchronization with an execution cycle of CPU in an execution cycle other than the execution cycle in which the PSRAM is accessed, the refresh can be carried out without deteriorating the processing efficiency. Also, there will not occur such malfunction as would destroy the data due to competition of refresh, so that the refresh can be properly performed. After a necessary number of refreshes has been counted up, refresh will not be performed until a reset. Accordingly, excessive refresh will never be executed, as compared with the data hold specification of the PSRAM. As a result, electric current consumption can be suppressed from increasing.

In the information processing apparatus of the fourth embodiment, if the PSRAM has not been refreshed completely at a time point when the first set period expires, the original program is temporarily suspended and an interrupt program for executing a process other than accessing the PSRAM is executed, whereby refresh of the PSRAM is enabled. Thus, proper refresh of the PSRAM can be attained without shortage.

Also, if it is arranged that in the event that any abnormality such as a runaway of software has erupted, the CPU is forcedly reset by a reset signal outputted by the timer so as to return to normal operation, then refresh of the PSRAM can be performed properly.

Also, if the first set period is set to one half or less of the refresh cycle specified for the PSRAM, refresh can be performed within a manufacturer-specified range, whatever conditions the access to the PSRAM is subject to.

Also, if the second set period is set to a length exceeding the time necessary for the PSRAM to be refreshed in succession completely, the second reset signal will not be outputted if the interrupt program is executed normally, and the second reset signal will be outputted only when an abnormality such as a runaway of software has erupted. Accordingly, only when an abnormality has erupted, the CPU is reset by the second reset signal so that it can be freed from the abnormal state and returned to normal operation. As a result, refresh necessary for the PSRAM to maintain data can be carried out properly.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An information processing apparatus having:
   a system clock generator for generating or stopping generating a system clock;
   a central processing unit (CPU) for outputting a chip-enable signal representing by high or low level whether or not a pseudo static random access memory (PSRAM) is accessed, and a refresh signal representing by high or low level whether or not the PSRAM is refreshed, by using the system clock as a reference; and
   PSRAM which has a chip-enable terminal for receiving a chip-enable signal and a refresh terminal for receiving a refresh signal and which has a self-refresh mode in which the PSRAM itself refreshes its storage contents when the chip-enable terminal is held at a level representing that the PSRAM is not accessed and the refresh terminal is held at a level representing that the PSRAM is not refreshed, respectively, for a specified time duration or more, the information processing apparatus comprising:

a self-refresh setter for, when the system clock generator is oscillating, producing an output signal of a high or low specific level and for, when the system clock generator has stopped oscillation, producing the output signal as it is inverted in level after a certain time elapse since the stop of oscillation; and logic circuits for latching a chip-enable signal inputted to the chip-enable terminal of the PSRAM at a level representing that the PSRAM is not accessed, and latching a refresh signal inputted to the refresh terminal of the PSRAM at a level representing that the PSRAM is refreshed, respectively, after a certain time elapse since the system clock generator has stopped oscillation, based on an output of the self-refresh setter.

2. An information processing apparatus having:

a CPU for outputting a chip-enable signal representing by high or low level whether or not PSRAM is accessed, and a refresh signal representing by high or low level whether or not the PSRAM is refreshed; and PSRAM having a chip-enable terminal for receiving the chip-enable signal and a refresh terminal for receiving the refresh signal, and having a self-refresh mode in which the PSRAM itself refreshes its storage contents when the chip-enable terminal is held at a level representing that the PSRAM is not accessed and the refresh terminal is held at a level representing that the PSRAM is not refreshed, respectively, for a certain time duration or more, the information processing apparatus comprising a voltage detector for detecting whether or not a power supply voltage is not less than a reference value and producing an output signal representing a detection result, wherein the CPU has a means for holding a chip-enable signal inputted to the chip-enable terminal of the PSRAM at the level representing that the PSRAM is not accessed, and holding a refresh signal inputted to the refresh terminal of the PSRAM at the level representing that the PSRAM is refreshed, respectively, when the CPU has received an output signal of the voltage detector and the power supply voltage is less than the reference value.

3. An information processing apparatus comprising:

PSRAM which is refreshed upon receiving a refresh signal representing by high or low level whether or not the PSRAM is refreshed if the refresh signal is at active level representing that the PSRAM is refreshed;

a CPU for outputting an execution-cycle reference signal representing an execution cycle at which the PSRAM is processed and a chip-enable signal representing by high or low level whether or not the PSRAM is accessed;

a counter for counting a number of times to which the PSRAM has been refreshed after the counter is reset, and for outputting a refresh-enable instruction signal representing that refresh is executable, throughout a period until a necessary number of refreshes needed to refresh the PSRAM completely is counted up, and outputting a refresh-halt instruction signal representing that refresh is halted after the necessary number of refreshes has been counted up;

a timer for starting count when the counter is reset, and outputting a first reset signal to reset the counter when the timer counts up a first set period corresponding to a refresh cycle specified for the PSRAM; and a refresh controller for outputting the refresh signal at the active level to the PSRAM in synchronization with the execution-cycle reference signal when the refresh controller has received from the counter a refresh-enable instruction signal and moreover has received from the CPU a chip-enable signal of the level representing that the PSRAM is not accessed, and for outputting the refresh signal at an inactive level representing that the PSRAM is not refreshed when the refresh controller has received from the counter a refresh-halt instruction signal and moreover has received from the CPU a chip-enable signal of the level representing that the PSRAM is accessed.

4. The information processing apparatus according to claim 3, wherein the refresh controller outputs an interrupt request signal to the CPU if the refresh controller has received from the counter a refresh-enable instruction signal at a time point when the timer outputs the first reset signal; and the CPU has a means for executing an interrupt program in which a process other than accessing the PSRAM is executed, while holding the chip-enable signal at a level representing that the PSRAM is not accessed, throughout a period from when the CPU receives the interrupt request signal until the counter outputs a refresh-halt instruction signal.

* * * * *